(12) United States Patent
Ito et al.

(10) Patent No.: US 9,190,365 B2
(45) Date of Patent: Nov. 17, 2015

(54) GLASS COMPOSITION FOR PROTECTING SEMICONDUCTOR JUNCTION, METHOD OF MANUFACTURING SEMICONDUCTOR DEVICE AND SEMICONDUCTOR DEVICE

(71) Applicant: SHINDENGEN ELECTRIC MANUFACTURING CO., LTD., Chiyoda-ku, Tokyo (JP)

(72) Inventors: Koji Ito, Hanno (JP); Atsushi Ogasawara, Hanno (JP); Koya Muyari, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/370,782

(22) PCT Filed: Apr. 26, 2013

(86) PCT No.: PCT/JP2013/062513
§ 371 (c)(1),
(2) Date: Jul. 7, 2014

(87) PCT Pub. No.: WO2013/168623
PCT Pub. Date: Nov. 14, 2013

(65) Prior Publication Data
US 2015/0155244 A1     Jun. 4, 2015

(30) Foreign Application Priority Data

May 8, 2012   (WO) .................. PCT/JP2012/061778

(51) Int. Cl.
*H01L 21/00*       (2006.01)
*H01L 23/00*       (2006.01)
(Continued)

(52) U.S. Cl.
CPC .............. *H01L 23/564* (2013.01); *C03C 3/091* (2013.01); *C03C 3/093* (2013.01); *C03C 8/02* (2013.01);
(Continued)

(58) Field of Classification Search
CPC ................ H01L 23/564; H01L 23/291; H01L 21/02112; H01L 23/3171; H01L 21/316; H01L 21/76232; H01L 29/66136; H01L 29/8611; H01L 29/8613; H01L 2924/0002; H01L 2924/00; C03C 3/091; C03C 8/02; C03C 2204/00; C03C 2207/00; C03C 3/093
See application file for complete search history.

(56) References Cited

U.S. PATENT DOCUMENTS 4,293,659 A * 10/1981 Svoboda ......................... 525/28
4,959,330 A *  9/1990 Donohue et al. ................. 501/8
(Continued)

FOREIGN PATENT DOCUMENTS

| JP | 692687 A | 4/1994 |
|----|----------|--------|
| JP | 200216272 A | 1/2002 |

(Continued)

OTHER PUBLICATIONS

International Search Report mailed Jul. 30, 2013, corresponds to PCT/JP2013/062513.

*Primary Examiner* — Nikolay Yushin
(74) *Attorney, Agent, or Firm* — Hauptman Ham, LLP

(57) ABSTRACT

A glass composition for protecting a semiconductor junction is made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, and contains no filler.

21 Claims, 14 Drawing Sheets

(51) Int. Cl.
  *H01L 29/00*   (2006.01)
  *H01L 23/29*   (2006.01)
  *H01L 23/31*   (2006.01)
  *H01L 29/66*   (2006.01)
  *H01L 29/861*  (2006.01)
  *H01L 21/02*   (2006.01)
  *H01L 21/762*  (2006.01)
  *C03C 3/091*   (2006.01)
  *C03C 3/093*   (2006.01)
  *C03C 8/02*    (2006.01)
  *H01L 21/316*  (2006.01)

(52) U.S. Cl.
  CPC ........ *H01L 21/02112* (2013.01); *H01L 21/316* (2013.01); *H01L 21/76232* (2013.01); *H01L 23/291* (2013.01); *H01L 23/3171* (2013.01); *H01L 29/66136* (2013.01); *H01L 29/8611* (2013.01); *H01L 29/8613* (2013.01); *C03C 2204/00* (2013.01); *C03C 2207/00* (2013.01); *H01L 2924/0002* (2013.01)

(56) References Cited

U.S. PATENT DOCUMENTS

| | | | |
|---|---|---|---|
| 7,544,629 B2 * | 6/2009 | Ito et al. | 501/32 |
| 2002/0023674 A1 | 2/2002 | Sugawara et al. | |
| 2009/0189257 A1 * | 7/2009 | Seki et al. | 257/626 |
| 2011/0028300 A1 * | 2/2011 | Zou et al. | 501/78 |
| 2013/0075873 A1 * | 3/2013 | Ogasawara et al. | 257/632 |
| 2013/0154064 A1 * | 6/2013 | Ogasawara et al. | 257/650 |
| 2014/0353851 A1 * | 12/2014 | Muyari et al. | 257/794 |
| 2014/0361416 A1 * | 12/2014 | Ogasawara et al. | 257/650 |

FOREIGN PATENT DOCUMENTS

| | | | |
|---|---|---|---|
| JP | 200487955 | A | 3/2004 |
| JP | 201120864 | A | 2/2011 |
| JP | 4927237 | B1 | 5/2012 |

* cited by examiner

| item | | example 1 | example 2 | example 3 | example 4 | example 5 | comparison example 1 | comparison example 2 | comparison example 3 | comparison example 4 | comparison example 5 | comparison example 6 | comparison example 7 | comparison example 8 | comparison example 9 |
|---|---|---|---|---|---|---|---|---|---|---|---|---|---|---|---|
| composition ratio (mol ratio) | $SiO_2$ | 65.3 | 65.3 | 65.3 | 65.0 | 64.7 | 60.0 | 50.6 | 58.1 | 55.3 | 43.6 | 49.6 | 58.3 | 58.3 | 61.3 |
| | $B_2O_3$ | 11.8 | 11.8 | 11.8 | 11.8 | 11.7 | 8.0 | 12.4 | 5.6 | 13.5 | 11.9 | 12.1 | 11.7 | 11.7 | 9.8 |
| | $Al_2O_3$ | 12.1 | 12.1 | 12.8 | 12.0 | 11.9 | 12.0 | 12.6 | 12.4 | 13.8 | 12.1 | 12.4 | 12.0 | 14.0 | 10.0 |
| | ZnO | 0 | 0 | 0 | 0 | 0 | 9.0 | 14.6 | 14.3 | 4.5 | 14.1 | 14.3 | 12.8 | 4.8 | 14.0 |
| | alkaline earth metal — CaO | 10.8 | 0 | 6.7 | 5.4 | 5.3 | 5.0 | 4.6 | 5.5 | 7.3 | 5.4 | 5.5 | 2.7 | 7.8 | 4.2 |
| | alkaline earth metal — BaO | 0 | 10.8 | 4.0 | 3.2 | 3.2 | 3.0 | 2.8 | 3.3 | 5.0 | 3.2 | 3.3 | 1.6 | 2.7 | 1.1 |
| | alkaline earth metal — MgO | 0 | 0 | 0 | 2.1 | 2.1 | 2.0 | 1.8 | 2.2 | 0 | 2.2 | 2.2 | 1.1 | 0.7 | 0.7 |
| | NiO | 0 | 0 | 0 | 0.5 | 0.5 | 0 | 0.6 | 0.6 | 0.6 | 0.5 | 0.6 | 0 | 0 | 0 |
| | $ZrO_2$ | 0 | 0 | 0 | 0 | 0.5 | 1.0 | 0 | 0 | 0 | 2.0 | 0 | 0 | 0 | 0 |
| | PbO | 0 | 0 | 0 | 0 | 0 | 0 | 0 | 0 | 0 | 0 | 0 | 0 | 0 | 0 |
| | total | 100 | 100 | 100 | 100 | 100 | 100 | 100 | 100 | 100 | 100 | 100 | 100 | 100 | 100 |
| evaluation item | evaluation item 1 (environmental burden) | good | good | good | good | good | good | good | good | good | good | good | good | good | good |
| | evaluation item 2 (baking temperature) | good (930) | good (960) | good (970) | good (950) | good (965) | good (880) | good (860) | good (865) | good (950) | good (810) | good (790) | good (815) | good (900) | good (810) |
| | evaluation item 3 (resistance to chemicals) | good | good | good | good | good | bad | bad | bad | bad | bad | bad | — | — | — |
| | evaluation item 4 (average linear expansion coefficient) | good (3.56) | good (3.69) | good (3.42) | good (3.33) | good (3.42) | good (4.02) | good (4.09) | good (4.32) | good (4.01) | good (4.23) | good (4.07) | good (3.85) | good (3.47) | good (3.16) |
| | evaluation item 5 (insulation property) | good | good | good | good | good | good | good | good | bad | bad | bad | — | — | — |
| | evaluation item 6 (presence or non-presence of crystallization) | good | good | bad | good | good | good | good | good | good | good | good | — | — | — |
| | evaluation item 7 (presence or non-presence of bubbles) | good | good | good | good | good | bad | bad | bad | bad | bad | bad | — | — | — |
| | evaluation item 7 reference (no insulation layer) | bad | bad | bad | good | good | bad | bad | bad | bad | bad | bad | — | — | — |
| comprehensive evaluation | | good | good | good | good | good | bad | bad | bad | bad | bad | bad | — | — | — |

FIG.9

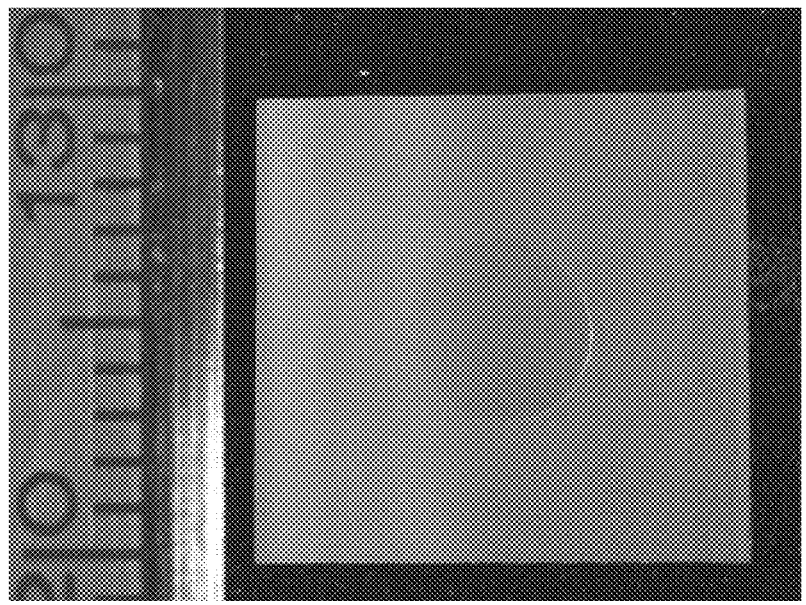

FIG.10

| type | test method 1 | | | | test method 2 | | comprehensive evaluation |
|---|---|---|---|---|---|---|---|
| | before test | after test | reduction of weight | individual evaluation | average stepped portion | individual evaluation | |
| | mg | mg | mg | | μm | | |
| example 1 | 66.3 | 65.7 | 0.6 | good | 3.0 | good | good |
| example 2 | 68.0 | 66.3 | 1.7 | good | 5.3 | good | good |
| example 3 | 62.3 | 61.7 | 0.6 | good | 3.3 | good | good |
| example 4 | 76.4 | 75.4 | 1.0 | good | 3.8 | good | good |
| example 5 | 68.0 | 66.9 | 1.1 | good | 3.8 | good | good |
| comparison example 1 | 77.9 | 76.2 | 1.7 | good | 6.7 | bad | bad |
| comparison example 2 | 84.1 | 77.2 | 6.9 | bad | 16.6 | bad | bad |
| comparison example 3 | 82.0 | 78.4 | 3.6 | bad | 10.6 | bad | bad |
| comparison example 4 | 79.8 | 75.9 | 3.9 | bad | 10.0 | bad | bad |
| comparison example 5 | 80.2 | 76.0 | 4.2 | bad | 11.8 | bad | bad |
| comparison example 6 | 77.6 | 73.6 | 4.0 | bad | 12.5 | bad | bad |

FIG.11

FIG.13A
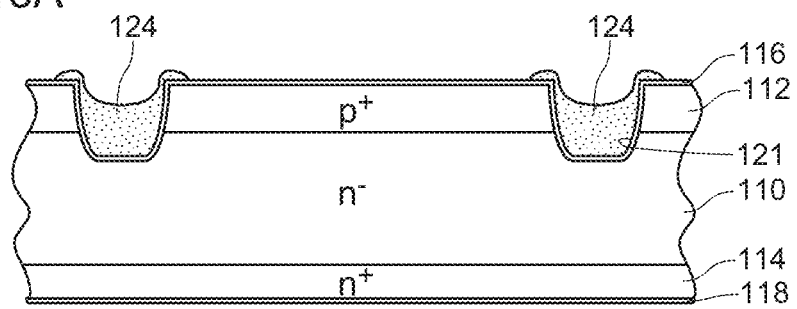
FIG.13B
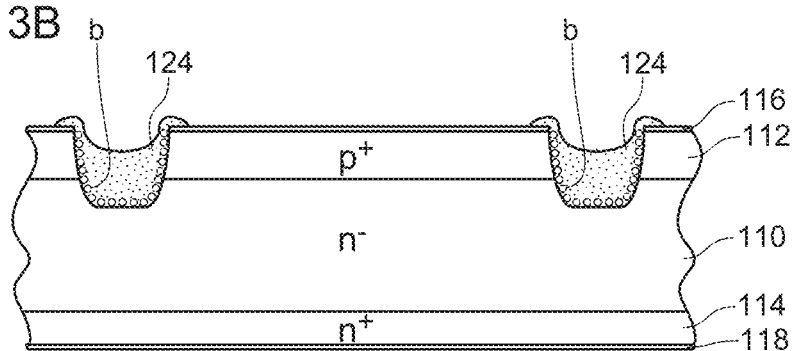
with insulation layer
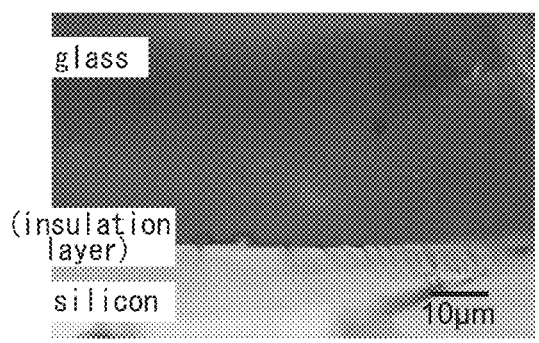
FIG.14A
no insulation layer
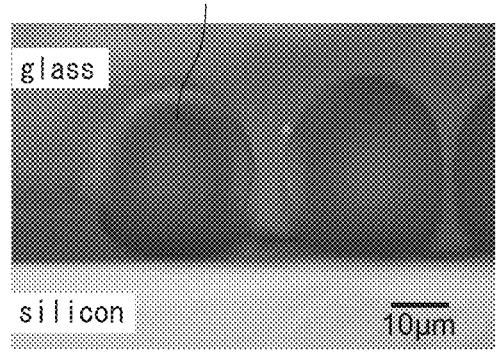
FIG.14B

GLASS COMPOSITION FOR PROTECTING SEMICONDUCTOR JUNCTION, METHOD OF MANUFACTURING SEMICONDUCTOR DEVICE AND SEMICONDUCTOR DEVICE

RELATED APPLICATIONS

The present application is a National Phase of International Application Number PCT/JP2013/062513, filed Apr. 26, 2013, which claims priority from International Application Number PCT/JP2012/061778, filed May 8, 2012.

TECHNICAL FIELD

The present invention relates to a glass composition for protecting a semiconductor junction, a method of manufacturing a semiconductor device and such a semiconductor device.

BACKGROUND ART

There has been known a method of manufacturing a semiconductor device where a glass layer for passivation is formed such that the glass layer covers a pn junction exposure portion in a process of manufacturing a mesa-type semiconductor device (see patent literature 1, for example).

FIG. 15A to FIG. 15D and FIG. 16A to FIG. 16D are views for explaining such a conventional method of manufacturing a semiconductor device. FIG. 15A to FIG. 15D and FIG. 16A to FIG. 16D are views showing respective steps of the conventional method.

The conventional method of manufacturing a semiconductor device includes, as shown in FIG. 15A to FIG. 15D and FIG. 16A to FIG. 16D, "semiconductor base body forming step", "trench forming step", "glass layer forming step", "photoresist forming step", "oxide film removing step", "roughened surface region forming step", "electrode forming step", and "semiconductor base body cutting step" in this order. Hereinafter, the conventional method of manufacturing a semiconductor device is explained in the order of these steps.

(a) Semiconductor Base Body Forming Step

Firstly, a $p^+$ type diffusion layer 912 is formed by diffusion of a p type impurity from one surface of an $n^-$ type semiconductor substrate ($n^-$ type silicon substrate) 910, and an $n^+$ type diffusion layer 914 is formed by diffusion of an n type impurity from the other surface of the $n^-$ type semiconductor substrate 910 thus forming a semiconductor base body in which a pn junction arranged parallel to a main surface of the semiconductor base body is formed. Thereafter, oxide films 916, 918 are formed by thermal oxidation on a surface of the $p^+$ type diffusion layer 912 and a surface of the $n^+$ type diffusion layer 914 respectively (see FIG. 15A).

(b) Trench Forming Step

Next, predetermined opening portions are formed on the oxide film 916 at predetermined positions by photo etching. After etching the oxide film, subsequently, the semiconductor base body is etched thus forming trenches 920 having a depth exceeding the pn junction from one surface of the semiconductor base body (see FIG. 15B).

(c) Glass Layer Forming Step

Next, a layer made of the glass composition for protecting a semiconductor junction is formed on inner surfaces of the trenches 920 and a surface of the semiconductor base body in the vicinity of the trenches 920 by an electrophoresis method, and the layer made of the glass composition for protecting a semiconductor junction is baked so that a glass layer 924 for passivation is formed on surfaces of the trenches 920 (see FIG. 15C).

(d) Photoresist Forming Step

Next, a photoresist 926 is formed such that the photoresist 926 covers a surface of the glass layer 924 (see FIG. 15D).

(e) Oxide Film Removing Step

Next, the oxide film 916 is etched using the photoresist 926 as a mask so that the oxide film 916 in a portion 930 where an Ni plating electrode film is formed is removed (see FIG. 16A).

(f) Roughened Surface Region Forming Step

Next, surface roughening treatment is applied to a surface of the semiconductor base body in the portion 930 where the Ni plating electrode film is formed thus forming a roughened surface region 932 for increasing adhesion between the Ni plating electrode and the semiconductor base body (see FIG. 16B).

(g) Electrode Forming Step

Next, an Ni plating is applied to the semiconductor base body thus forming an anode electrode 934 on the roughened surface region 932, and forming a cathode electrode 936 on the other surface of the semiconductor base body (see FIG. 16C).

(h) Semiconductor Base Body Cutting Step

Next, the semiconductor base body is cut by dicing or the like at a center portion of the glass layer 924 thus dividing the semiconductor base body into a plurality of chips whereby mesa-type semiconductor devices (pn diodes) 900 are formed (see FIG. 16D).

As has been explained heretofore, the conventional method of manufacturing a semiconductor device includes the step of forming the trenches 920 exceeding the pn junction from one surface of the semiconductor base body where the pn junction arranged parallel to the main surface is formed (see FIG. 15A and FIG. 15B), and the step of forming the glass layer 924 for passivation in the inside of the trench 920 such that the glass layer 924 covers a pn junction exposure portion (see FIG. 15C). Accordingly, in the conventional method of manufacturing a semiconductor device, by cutting the semiconductor base body after forming the glass layer 924 for passivation in the inside of the trench 920, mesa-type semiconductor devices having high reliability can be manufactured.

PRIOR ART LITERATURE

Patent Literature

Patent literature 1 JP-A-2004-87955

SUMMARY OF THE INVENTION

Technical Problem

A glass material which is used for forming a glass layer for passivation is required to satisfy following conditions (a) to (d), that is, the condition (a) that the glass material can be baked at a proper temperature, the condition (b) that the glass material withstands chemicals (aqua regia, plating liquid, fluoric acid) used in steps, the condition (c) that the glass material has a linear expansion coefficient close to a linear expansion coefficient of silicon for preventing warping of a wafer during steps (particularly an average linear expansion coefficient at a temperature of 50° C. to 550° C. being close to a linear expansion coefficient of silicon), and the condition (d) that the glass material has excellent insulation property. In view of the above, "a glass material containing lead silicate as a main component" has been widely used conventionally.

However, "the glass material containing lead silicate as a main component" contains lead which imposes a heavy burden on an environment and hence, it is thought that the use of "the glass material containing lead silicate as a main component" will be prohibited in the near future.

The present invention has been made in view of such circumstances, and it is an object of the present invention to provide a glass composition for protecting a semiconductor junction, a method of manufacturing a semiconductor device and such a semiconductor device which can manufacture a semiconductor device having high reliability using a glass material containing no lead in the same manner as a conventional case where "a glass material containing lead silicate as a main component" is used.

Solution to Problem

[1] According to one aspect of the present invention, there is provided a glass composition for protecting a semiconductor junction, wherein the glass composition for protecting a semiconductor junction is made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, and contains no filler.

[2] In the glass composition for protecting a semiconductor junction according to the present invention, it is preferable that the raw material contains, as oxide of alkaline earth metal, one oxide of alkaline earth metal selected from a group consisting of CaO and BaO.

[3] In the glass composition for protecting a semiconductor junction according to the present invention, it is preferable that the raw material contains, as the oxide of alkaline earth metal, two oxides of alkaline earth metals selected from a group consisting of CaO, BaO and MgO.

[4] In the glass composition for protecting a semiconductor junction according to the present invention, it is preferable that the raw material contains, as the oxide of alkaline earth metal, all oxides of alkaline earth metals consisting of CaO, BaO and MgO.

[5] In the glass composition for protecting a semiconductor junction according to the present invention, it is preferable that the raw material substantially contains no P.

[6] In the glass composition for protecting a semiconductor junction according to the present invention, it is preferable that the raw material substantially contains no Bi.

[7] In the glass composition for protecting a semiconductor junction according to the present invention, it is preferable that the raw material further contains at least one metal oxide selected from a group consisting of nickel oxide, copper oxide, manganese oxide and zirconium oxide.

[8] In the glass composition for protecting a semiconductor junction according to the present invention, it is preferable that an average linear expansion coefficient within a temperature range of 50° C. to 550° C. falls within a range of $3.3 \times 10^{-6}$ to $4.5 \times 10^{-6}$.

[9] In the glass composition for protecting a semiconductor junction according to the present invention, it is preferable that the content of $SiO_2$ fall within a range of 50.0 mol % to 68.0 mol %, the content of $B_2O_3$ fall within a range of 6.0 mol % to 18.0 mol %, the content of $Al_2O_3$ fall within a range of 7.0 mol % to 18.0 mol %, and the content of the oxide of alkaline earth metal fall within a range of 7.0 mol % to 18.0 mol %.

[10] According to another aspect of the present invention, there is provided a method of manufacturing a semiconductor device including, in the following order: a first step of preparing a semiconductor element having a pn junction exposure portion where a pn junction is exposed; and a second step of forming a glass layer such that the glass layer covers the pn junction exposure portion, wherein in the second step, the glass layer is formed using a glass composition for protecting a semiconductor junction which is made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, and contains no filler.

[11] In the method of manufacturing a semiconductor device according to the present invention, it is preferable that the first step includes: a step of preparing a semiconductor base body having a pn junction parallel to a main surface thereof; and a step of forming the pn junction exposure portion in the inside of a trench by forming the trench from one surface of the semiconductor base body with a depth exceeding the pn junction, and the second step includes a step of forming the glass layer such that the glass layer covers the pn junction exposure portion in the inside of the trench.

[12] In the method of manufacturing a semiconductor device according to the present invention, it is preferable that the second step include a step of forming the glass layer such that the glass layer directly covers the pn junction exposure portion in the inside of the trench.

[13] In the method of manufacturing a semiconductor device according to the present invention, it is preferable that the second step include a step of forming an insulation layer or a high-resistance semi-insulation layer on the pn junction exposure portion in the inside of the trench, and a step of forming the glass layer such that the glass layer covers the pn junction exposure portion with the insulation layer or a high-resistance semi-insulation layer interposed therebetween.

[14] In the method of manufacturing a semiconductor device according to the present invention, it is preferable that the first step includes a step of forming the pn junction exposure portion on a surface of a semiconductor base body, and the second step includes a step of forming the glass layer such that the glass layer covers the pn junction exposure portion on the surface of the semiconductor base body.

[15] In the method of manufacturing a semiconductor device according to the present invention, it is preferable that the second step includes a step of forming the glass layer such that the glass layer directly covers the pn junction exposure portion on the surface of the semiconductor base body.

[16] In the method of manufacturing a semiconductor device according to the present invention, it is preferable that the second step includes a step of forming an insulation layer or a high-resistance semi-insulation layer on the pn junction exposure portion on a surface of the semiconductor base body, and a step of forming the glass layer such that the glass layer covers the pn junction exposure portion with the insulation layer or a high-resistance semi-insulation layer interposed therebetween.

[17] In the method of manufacturing a semiconductor device according to the present invention, it is preferable that the glass composition for protecting a semiconductor junction be a glass composition for protecting a semiconductor junction which substantially contains no multivalent element as a defoaming agent.

[18] In the method of manufacturing a semiconductor device according to the present invention, it is preferable that the multivalent element contains V, Mn, Sn, Ce, Nb and Ta.

[19] According to still another aspect of the present invention, there is provided a semiconductor device including: a semiconductor element having a pn junction exposure portion where a pn junction is exposed; and a glass layer which is formed such that the glass layer covers the pn junction exposure portion, wherein the glass layer is formed using a glass composition for protecting a semiconductor junction made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, the glass composition for protecting a semiconductor junction containing no filler.

In the present invention, "to contain at least some specific components ($SiO_2$, $B_2O_3$ and the like)" means not only the case where the glass composition contains only such specific components but also the case where the glass composition also contains other components which can be usually contained in the glass composition besides such specific components.

In the present invention, "to substantially contain no specific element (Pb, As or the like)" means that the glass composition contains no any such a specific element as the specific component, and does not exclude the glass composition in which the above-mentioned specific element is mixed as an impurity in the glass materials which constitute respective components of glass.

When the glass composition for protecting a semiconductor junction according to the present invention is so-called glass composition of oxide system, "to contain no specific element (Pb, As or the like)" means that the glass composition contains no oxide of the specific element, no nitride of the specific element or the like.

In the present invention, the high-resistance semi-insulation layer means a semi-insulation layer having high resistance such as an SIPOS (Semi-Insulated Polycrystalline Silicon), for example, and may be also referred to as a high-resistance layer or a semi-insulation layer.

Advantage of the Invention

According to the glass composition for protecting a semiconductor junction, the method of manufacturing a semiconductor device and the semiconductor device of the present invention, as can be clearly understood from examples described later, a semiconductor device having high reliability can be manufactured by using a glass material which contains no lead in the same manner as the conventional case where "a glass material containing lead silicate as a main component" is used.

Further, according to the glass composition for protecting a semiconductor junction, the method of manufacturing a semiconductor device and the semiconductor device of the present invention, the glass composition for protecting a semiconductor junction substantially contains no Zn and hence, as can be clearly understood from the example described later, resistance to chemicals (particularly florid acid resistance) is increased thus enabling the manufacture of a highly reliable semiconductor device. In this case, when the resistance to a fluoric acid is increased, it is unnecessary to protect a glass layer by a resist in the step of removing a silicon oxide film by etching during the steps (see FIG. 1D described later) and hence, it is possible to acquire an advantageous effect that the steps can be simplified.

Further, according to the glass composition for protecting a semiconductor junction, the method of manufacturing a semiconductor device and the semiconductor device of the present invention, the glass composition for protecting a semiconductor junction contains oxide of alkaline earth metal and substantially contains no Zn and hence, the glass layer is hardly crystallized in the process of vitrification as can be clearly understood from the embodiment explained later.

Further, according to the glass composition for protecting a semiconductor junction, the method of manufacturing a semiconductor device and the semiconductor device of the present invention, the glass composition for protecting a semiconductor junction contains oxide of alkaline earth metal and substantially contains no Zn. Accordingly, as can be clearly understood from the embodiment described later, it is possible to set an average linear expansion coefficient of the glass composition for protecting a semiconductor junction within a temperature range of 50° C. to 550° C. to a value ($3.3\times10^{-6}$ to $4.5\times10^{-6}$, for example) close to a linear expansion coefficient of silicon within a range where the crystallization is not generated in the process of vitrification. Accordingly, even when a thin wafer is used, the warping of the wafer during steps can be prevented. Further, even when the glass layer is stacked with a large thickness, the warping of the wafer during steps can be prevented and hence, the more highly reliable semiconductor device can be manufactured.

In steps of manufacturing a semiconductor device, when the glass composition for protecting a semiconductor junction containing a filler is used as the glass composition for protecting a semiconductor junction, there may be a case where at the time of forming a layer made of the glass composition for protecting a semiconductor junction such that the layer covers the pn junction exposure portion, it is difficult to uniformly form the layer made of the glass composition for protecting a semiconductor junction. That is, when a layer made of the glass composition for protecting a semiconductor junction is formed by an electrophoresis method, it is difficult to uniformly form the layer made of the glass composition for protecting a semiconductor junction due to non-uniform electrophoresis. On the other hand, when a layer made of the glass composition for protecting a semiconductor junction is formed by a spin coating method, a screen printing method or a doctor blade method, there may be a case where it is difficult to uniformly form a layer made of the glass composition for protecting a semiconductor junction due to difference in particle size, specific gravity or the like.

To the contrary, according to the glass composition for protecting a semiconductor junction, the method of manufacturing a semiconductor device and the semiconductor device of the present invention, the layer where the glass composition for protecting a semiconductor junction is formed of the glass composition for protecting a semiconductor junction which contains no filler is used as and hence, in forming the layer made of the glass composition for protecting a semiconductor junction such that the layer covers the pn junction, it is possible to uniformly form the layer made of the glass composition for protecting a semiconductor junction.

The reason the glass composition substantially contains no Pb is that the object of the present invention lies in that a semiconductor device having high reliability can be manufactured by using a glass material which contains no lead in the same manner as the conventional case where "a glass material containing lead silicate as a main component" is used.

The reason the glass composition substantially contains neither As nor Sb is that these components are toxic and hence, there has been the movement to limit the use of these components.

The reason the glass composition substantially contains none of Li, Na and K is that when the glass composition contains these components, although the glass composition can acquire advantageous effects with respect to an average linear expansion coefficient and a baking temperature, there may be a case where the insulation property of the semiconductor device is lowered.

As the result of the extensive studies that the inventors of the present invention have made, the inventors have found that the glass composition which contains at least $SiO_2$, $B_2O_3$, $Al_2O_3$, CaO and oxide of alkaline earth metal can be used as the glass composition for protecting a semiconductor junction even when the glass composition substantially contains none of components (that is, Pb, As, Sb, Li, Na, K and Zn). That is, according to the glass composition for protecting a semiconductor junction according to the present invention, a highly reliable semiconductor device can be manufactured by using a glass material which contains no lead in the same manner as the conventional case where "a glass material containing lead silicate as a main component" is used.

BRIEF DESCRIPTION OF THE DRAWINGS

FIG. 9 is a Table showing conditions and results of examples.

FIG. 10 is a view showing a stepped portion between an etched portion and a non-etched portion.

FIG. 11 is a Table showing the result of a test method 1 and the result of a test method 2.

FIG. 13A and FIG. 13B are views for explaining bubbles b generated in the inside of a glass layer in a preliminary evaluation and a preliminary evaluation (reference).

FIG. 14A and FIG. 14B are photographs for explaining bubbles b generated in the inside of a glass layer in a subsequent evaluation and a subsequent evaluation (reference).

MODE FOR CARRYING OUT THE INVENTION

Figure 1A:
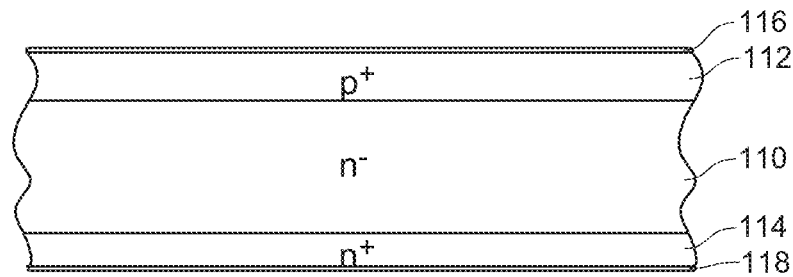
FIG. 1A to FIG. 1D are views for explaining a method of manufacturing a semiconductor device according to an embodiment 4.
Figure 1B:
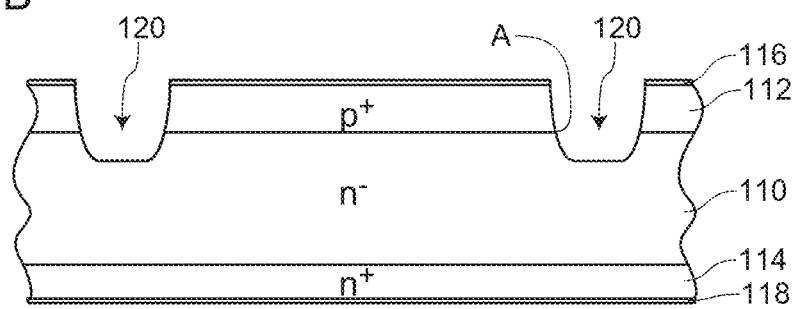

Hereinafter, a glass composition for protecting a semiconductor junction, a method of manufacturing a semiconductor device and such a semiconductor device according to the present invention are explained in conjunction with embodiments shown in the drawings.

[Embodiment 1]

The embodiment 1 relates to an embodiment of a glass composition for protecting a semiconductor junction.

The glass composition for protecting a semiconductor junction of the embodiment 1 is made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, and contains no filler. The raw material contains, as the oxide of alkaline earth metal, one oxide selected from a group consisting of CaO and BaO.

In the glass composition for protecting a semiconductor junction of the embodiment 1, the content of $SiO_2$ falls within a range of 50.0 mol % to 68.0 mol %, the content of $B_2O_3$ falls within a range of 6.0 mol % to 18.0 mol %, the content of $Al_2O_2$ falls within a range of 7.0 mol % to 18.0 mol %, the content of the oxide of alkaline earth metal falls within a range of 7.0 mol % to 18.0 mol %, and the content of nickel oxide falls within a range of 0.01 mol % to 3.0 mol %.

The above-mentioned raw material substantially contains no P. Further, the above-mentioned raw material substantially contains no Bi.

In the glass composition for protecting a semiconductor junction of the embodiment 1, an average linear expansion coefficient of the glass composition within a temperature range of 50° C. to 550° C. falls within a range of $3.3 \times 10^{-6}$ to $4.5 \times 10^{-6}$.

According to the glass composition for protecting a semiconductor junction of the embodiment 1, as can be clearly understood from examples described later, a highly reliable semiconductor device can be manufactured by using a glass material which contains no lead in the same manner as the conventional case where "a glass material containing lead silicate as a main component" is used.

According to the glass composition for protecting a semiconductor junction of the embodiment 1, the glass composition for protecting a semiconductor junction substantially contains no Zn and hence, as can be clearly understood from the example described later, resistance to chemicals (particularly fluoric acid resistance) is increased thus enabling the manufacture of a highly reliable semiconductor device. In this case, when the resistance to a fluoric acid is increased, it is unnecessary to protect a glass layer by a resist in the step of removing a silicon oxide film by etching during the steps (see FIG. 1D described later) and hence, it is possible to acquire an advantageous effect that the steps can be simplified.

According to the glass composition for protecting a semiconductor junction of the embodiment 1, the glass composition for protecting a semiconductor junction contains oxide of alkaline earth metal and substantially contains no Zn and hence, the glass layer is hardly crystallized in the process of vitrification as can be clearly understood from the examples explained later.

According to the glass composition for protecting a semiconductor junction of the embodiment 1, the glass composition for protecting a semiconductor junction contains oxide of alkaline earth metal and substantially contains no Zn. Accordingly, as can be clearly understood from the example described later, it is possible to make an average linear expansion coefficient of the glass composition for protecting a semiconductor junction within a temperature range of 50° C. to 550° C. approximate a linear expansion coefficient of silicon within a range that the glass composition is not crystallized in the process of vitrification. Accordingly, even when a thin wafer is used, the warping of the wafer during steps can be prevented. Further, even when the glass layer is stacked with a large thickness, the warping of the wafer during steps can be prevented and hence, the more highly reliable semiconductor device can be manufactured.

According to the glass composition for protecting a semiconductor junction of the embodiment 1, the glass composition for protecting a semiconductor junction contains no filler and hence, in forming the layer made of the glass composition for protecting a semiconductor junction such that the layer covers the pn junction exposure portion, it is possible to uniformly form the layer made of the glass composition for protecting a semiconductor junction.

According to the glass composition for protecting a semiconductor junction of the embodiment 1, the glass composition for protecting a semiconductor junction contains nickel oxide and hence, as can be clearly understood also from examples described later, it is possible to suppress the generation of bubbles which may be generated from an interface between a "layer made of the glass composition for protecting a semiconductor junction" formed by an electrophoresis method and a semiconductor base body (silicon or insulation layer) during a process of baking the layer made of the glass composition for protecting a semiconductor junction whereby the occurrence of a state where a reverse breakdown voltage characteristic of the semiconductor device is deteriorated can be suppressed.

The reason the content of $SiO_2$ is set to a value which falls within a range of 50.0 mol % to 68.0 mol % is that when the content of $SiO_2$ is less than 50.0 mol %, there may be a case where the resistance to chemicals is lowered or the insulation property is lowered, while when the content of $SiO_2$ exceeds 68.0 mol %, there exists a tendency that a baking temperature needs to be elevated. From these points of view, it is further preferable that the content of $SiO_2$ is set to a value which falls within a range of 58.0 mol % to 66.0 mol %.

The reason the content of $B_2O_3$ is set to a value which falls within a range of 6.0 mol % to 18.0 mol % is that when the content of $B_2O_3$ is less than 6.0 mol %, there is a tendency that a baking temperature needs to be elevated, while when the content of $B_2O_3$ exceeds 18.0 mol %, there is a tendency that an average linear expansion coefficient is increased. From these points of view, it is further preferable that the content of $B_2O_3$ is set to a value which falls within a range of 9.0 mol % to 15.0 mol %.

The reason the content of $Al_2O_3$ is set to a value which falls within a range of 7.0 mol % to 18.0 mol % is that when the content of $Al_2O_3$ is less than 7.0 mol %, there is a tendency that the glass composition is liable to be crystallized in the process of vitrification, while when the content of $Al_2O_3$ exceeds 18.0 mol %, there is a tendency that the insulation property is lowered. From these points of view, it is further preferable that the content of $Al_2O_3$ is set to a value which falls within a range of 9.0 mol % to 15.0 mol %.

The reason the content of oxide of alkaline earth metal is set to a value which falls within a range of 7.0 mol % to 18.0 mol % is that when the content of oxide of alkaline earth metal is less than 7.0 mol %, there is a tendency that a baking temperature needs to be elevated, while when the content of oxide of alkaline earth metal exceeds 18.0 mol %, there may be a case where the resistance to chemicals is lowered or the insulation property is lowered. From these points of view, it is further preferable that the content of oxide of alkaline earth metal is set to a value which falls within a range of 9.0 mol % to 15.0 mol %.

The reason the glass composition contains one of CaO and BaO as oxide of alkaline earth metal is that there is a case where the glass composition is liable to be crystallized in the process of vitrification when the glass composition contains only MgO as oxide of alkaline earth metal and hence, there may be a case where the use of Mg in the singe form as oxide of alkaline earth metal is difficult.

The reason the content of nickel oxide is set to a value which falls within a range of 0.01 mol % to 3.0 mol % is that when the content of nickel oxide is less than 0.01 mol %, there may be a case where it becomes difficult to suppress the generation of bubbles which may be generated from an interface between a "layer made of the glass composition for protecting a semiconductor junction" formed by an electrophoresis method and a semiconductor base body (silicon) in a process of baking the "layer made of the glass composition for protecting a semiconductor junction", while when the content of nickel oxide exceeds 3.0 mol %, there is a tendency that the glass composition is liable to be crystallized in the process of vitrification. From these points of view, it is further preferable that the content of nickel oxide is set to a value which falls within a range of 0.1 mol % to 1.5 mol %.

The glass composition for protecting a semiconductor junction of the embodiment 1 can be manufactured as follows. That is, raw materials ($SiO_2$, $H_3BO_3$, $Al_2O_3$, one oxide of alkaline earth metal out of $CaCO_3$ and $BaCO_3$, MgO and NiO) are prepared at the above-mentioned composition ratio (molar ratio), these raw materials are sufficiently mixed and stirred together by a mixer and, thereafter, the mixed raw material is put into a platinum crucible, a temperature of the mixed raw material is elevated up to a predetermined temperature (1550° C.) in an electric furnace and is melted for 2 hours. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus manufacturing the powdery glass composition.

[Embodiment 2]

The embodiment 2 relates to a glass composition for protecting a semiconductor junction.

The glass composition for protecting a semiconductor junction of the embodiment 2 basically contains the substantially same components as the glass composition for protecting a semiconductor junction of the embodiment 1. However, the glass composition for protecting a semiconductor junction of the embodiment 2 differs from the glass composition for protecting a semiconductor junction of the embodiment 1 with respect to the composition of oxide of alkaline earth metal. That is, the glass composition for protecting a semiconductor junction of the embodiment 2 contains two oxides of alkaline earth metals selected from a group consisting of CaO, BaO and MgO as oxide of alkaline earth metal.

With respect to the content of $SiO_2$, the content of $B_2O_3$, the content of $Al_2O_3$, the content of oxide of alkaline earth metal and the content of nickel oxide, the glass composition for protecting a semiconductor junction of the embodiment 2 has the same contents as the glass composition for protecting a semiconductor junction of the embodiment 1.

When the glass composition for protecting a semiconductor junction of the embodiment 2 contains CaO and BaO as oxides of alkaline earth metals, it is preferable that the content of CaO is set to a value which falls within a range of 3.0 mol % to 10.0 mol %, and the content of BaO is set to a value which falls within a range of 3.0 mol % to 10.0 mol %.

When the glass composition for protecting a semiconductor junction of the embodiment 2 contains CaO and MgO as oxides of alkaline earth metals, it is preferable that the content of CaO is set to a value which falls within a range of 3.0 mol % to 10.0 mol %, and the content of MgO is set to a value which falls within a range of 1.0 mol % to 5.0 mol %.

When the glass composition for protecting a semiconductor junction of the embodiment 2 contains BaO and MgO as two oxides of alkaline earth metals, it is preferable that the content of BaO is set to a value which falls within a range of 3.0 mol % to 10.0 mol %, and the content of MgO is set to a value which falls within a range of 1.0 mol % to 5.0 mol %.

In this manner, the glass composition for protecting a semiconductor junction of the embodiment 2 differs from the glass composition for protecting a semiconductor junction of the embodiment 1 with respect to the composition of oxide of alkaline earth metal. However, in the same manner as the glass composition for protecting a semiconductor junction of the embodiment 1, according to the glass composition for protecting a semiconductor junction of the embodiment 2, a highly reliable semiconductor device can be manufactured by using a glass material which contains no lead in the same manner as the conventional case where "a glass material containing lead silicate as a main component" is used.

Further, the glass composition for protecting a semiconductor junction of the embodiment 2 substantially contains no Zn. Accordingly, in the same manner as the glass composition for protecting a semiconductor junction of the embodiment 1, resistance to chemicals (particularly resistance to a fluoric acid) is increased so that a highly reliable semiconductor device can be manufactured. In this case, when the resistance to a fluoric acid is increased, it is unnecessary to protect the glass layer with a resist in the step of removing a silicon oxide film by etching or the like and hence, it is possible to acquire an advantageous effect that the steps can be simplified.

Further, the glass composition for protecting a semiconductor junction of the embodiment 2 contains oxide of alkaline earth metal and substantially contains no Zn. Accordingly, in the same manner as the glass composition for protecting a semiconductor junction of the embodiment 1, the glass composition is hardly crystallized in the process of vitrification.

Further, the glass composition for protecting a semiconductor junction of the embodiment 2 contains oxide of alkaline earth metal and substantially contains no Zn. Accordingly, in the same manner as the glass composition for protecting a semiconductor junction of the embodiment 1, it is possible to make an average linear expansion coefficient of the glass composition for protecting a semiconductor junction within a temperature range of 50° C. to 550° C. approximate a linear expansion coefficient of silicon within a range where the glass composition is hardly crystallized in the vitrification step. Accordingly, even when a thin wafer is used, the warping of the wafer during steps can be prevented. Further, even when the glass layer is stacked with a large thickness, the warping of the wafer during steps can be prevented and hence, the more highly reliable semiconductor device can be manufactured.

According to the glass composition for protecting a semiconductor junction of the embodiment 2, the glass composition for protecting a semiconductor junction contains nickel oxide. Accordingly, in the same manner as the glass composition for protecting a semiconductor junction of the embodiment 1, it is possible to suppress the generation of bubbles which may be generated from an interface between a "layer made of the glass composition for protecting a semiconductor junction" formed by an electrophoresis method and a semiconductor base body (silicon or insulation layer) during a process of baking the layer made of the glass composition for protecting a semiconductor junction whereby the occurrence of a state where a reverse breakdown voltage characteristic of the semiconductor device is deteriorated can be suppressed.

Further, according to the glass composition for protecting a semiconductor junction of the embodiment 2, the raw material contains two oxides of alkaline earth metals selected from a group consisting of CaO, BaO and MgO. Accordingly, compared to the glass composition for protecting a semiconductor junction of the embodiment 1, the glass composition for protecting a semiconductor junction of the embodiment 2 can also acquire an advantageous effect that it is possible to easily manufacture the glass having desired properties (glass having low baking temperature, high resistance to chemicals, an average linear expansion coefficient which falls within a predetermined range, being hardly crystallized, and hardly generating bubbles).

The glass composition for protecting a semiconductor junction of the embodiment 2 can be manufactured as follows. That is, raw materials ($SiO_2$, $H_3BO_3$, $Al_2O_3$, two oxides of alkaline earth metals selected from a group consisting of $CaCO_3$, $BaCO_3$ and MgO) and NiO) are prepared at the above-mentioned composition ratio (molar ratio), these raw materials are sufficiently mixed and stirred together by a mixer and, thereafter, the mixed raw material is put into a platinum crucible, and a temperature of the mixed raw material is elevated to a predetermined temperature (1550° C.) in an electric furnace and is melted for 2 hours. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus manufacturing the powdery glass composition.

[Embodiment 3]

The embodiment 3 relates to a glass composition for protecting a semiconductor junction.

The glass composition for protecting a semiconductor junction of the embodiment 3 basically contains the substantially same components as the glass composition for protecting a semiconductor junction of the embodiment 1. However, the glass composition for protecting a semiconductor junction of the embodiment 3 differs from the glass composition for protecting a semiconductor junction of the embodiment 1 with respect to the composition of oxide of alkaline earth metal. That is, the glass composition for protecting a semiconductor junction of the embodiment 3 contains all of CaO, BaO and MgO as oxides of alkaline earth metals.

With respect to the content of $SiO_2$, the content of $B_2O_3$, the content of $Al_2O_3$, the content of oxide of alkaline earth metal and the content of nickel oxide, the glass composition for protecting a semiconductor junction of the embodiment 3 has the same contents as the glass composition for protecting a semiconductor junction of the embodiment 1. Further, in the glass composition for protecting a semiconductor junction of the embodiment 3, it is preferable that, with respect to oxides of alkaline metal earths, the content of CaO is set to a value which falls within a range of 2.8 mol % to 7.8 mol %, the content of BaO is set to a value which falls within a range of 1.7 mol % to 4.7 mol %, and the content of MgO is set to a value which falls within a range of 1.1 mol % to 3.1 mol %.

With respect to the above-mentioned oxides of alkaline earth metals, the reason the content of CaO is set to a value which falls within a range of 2.8 mol % to 7.8 mol % is that when the content of CaO is less than 2.8 mol %, there is a tendency that a baking temperature needs to be elevated, while when the content of CaO exceeds 7.8 mol %, there may be a case where that the resistance to chemicals needs to be lowered or the insulation property needs to be lowered. From these points of view, it is further preferable that the content of CaO is set to a value which falls within a range of 3.3 mol % to 7.3 mol %.

The reason the content of BaO is set to a value which falls within a range of 1.7 mol % to 4.7 mol % is that when the content of BaO is less than 1.7 mol %, there is a tendency that a baking temperature needs to be elevated, while when the content of BaO exceeds 4.7 mol %, there may be a case where the resistance to chemicals needs to be lowered or the insulation property needs to be lowered. From these points of view, it is further preferable that the content of BaO is set to a value which falls within a range of 2.2 mol % to 4.2 mol %.

The reason the content of MgO is set to a value which falls within a range of 1.1 mol % to 3.1 mol % is that when the content of MgO is less than 1.1 mol %, there is a tendency that a baking temperature needs to be elevated, while when the content of MgO exceeds 3.1 mol %, there may be a case where the resistance to chemicals needs to be lowered or the insulation property needs to be lowered. From these points of view, it is further preferable that the content of MgO is set to a value which falls within a range of 1.6 mol % to 2.6 mol %.

In this manner, the glass composition for protecting a semiconductor junction of the embodiment 3 differs from the glass composition for protecting a semiconductor junction of the embodiment 1 with respect to the composition of oxide of alkaline earth metal. However, in the same manner as the glass composition for protecting a semiconductor junction of the embodiment 1, according to the glass composition for protecting a semiconductor junction of the embodiment 3, a highly reliable semiconductor device can be manufactured by using a glass material which contains no lead in the same manner as the conventional case where "a glass material containing lead silicate as a main component" is used.

Further, the glass composition for protecting a semiconductor junction of the embodiment 3 substantially contains no Zn. Accordingly, in the same manner as the glass composition for protecting a semiconductor junction of the embodiment 1, resistance to chemicals (particularly resistance to a fluoric acid) is increased so that a highly reliable semiconductor device can be manufactured. In this case, when the resistance to a fluoric acid is increased, it is unnecessary to protect the glass layer with a resist in the step of removing a silicon oxide film by etching or the like and hence, it is possible to acquire an advantageous effect that the steps can be simplified.

Further, the glass composition for protecting a semiconductor junction of the embodiment 3 contains oxide of alkaline earth metal and substantially contains no Zn. Accordingly, in the same manner as the glass composition for protecting a semiconductor junction of the embodiment 1, the glass composition is hardly crystallized in the process of vitrification.

Further, the glass composition for protecting a semiconductor junction of the embodiment 3 contains oxide of alkaline earth metal and substantially contains no Zn. Accordingly, in the same manner as the glass composition for protecting a semiconductor junction of the embodiment 1, it is possible to make an average linear expansion coefficient of the glass composition for protecting a semiconductor junction within a temperature range of 50° C. to 550° C. approximate a linear expansion coefficient of silicon within a range where the glass composition is hardly crystallized in the vitrification step. Accordingly, even when a thin wafer is used, the warping of the wafer during steps can be prevented. Further, even when the glass layer is stacked with a large thickness, the warping of the wafer during steps can be prevented and hence, the more highly reliable semiconductor device can be manufactured.

According to the glass composition for protecting a semiconductor junction of the embodiment 3, the glass composition for protecting a semiconductor junction contains nickel oxide. Accordingly, in the same manner as the glass composition for protecting a semiconductor junction of the embodiment 1, it is possible to suppress the generation of bubbles which may be generated from an interface between a "layer made of the glass composition for protecting a semiconductor junction" formed by an electrophoresis method and a semiconductor base body (silicon or insulation layer) during a process of baking the layer made of the glass composition for protecting a semiconductor junction whereby the occurrence of a state where a reverse breakdown voltage characteristic of the semiconductor device is deteriorated can be suppressed.

Further, according to the glass composition for protecting a semiconductor junction of the embodiment 3, the raw material contains all of CaO, BaO and MgO as oxides of alkaline earth metals. Accordingly, compared to the glass composition for protecting a semiconductor junction of the embodiment 2, the glass composition for protecting a semiconductor junction of the embodiment 3 can also acquire an advantageous effect that it is possible to further easily manufacture the glass having desired properties (glass having low baking temperature, high resistance to chemicals, an average linear expansion coefficient which falls within a predetermined range, being hardly crystallized, and hardly generating bubbles).

The glass composition for protecting a semiconductor junction of the embodiment 3 can be manufactured as follows. That is, raw materials ($SiO_2$, $H_3BO_3$, $Al_2O_3$, $CaCO_3$, $BaCO_3$, MgO and NiO) are prepared at the above-mentioned composition ratio (molar ratio), these raw materials are sufficiently mixed and stirred by a mixer and, thereafter, the mixed raw material is put into a platinum crucible, and a temperature of the mixed raw material is elevated to a predetermined temperature (1550° C.) in an electric furnace and is melted for 2 hours. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus manufacturing the powdery glass composition.

[Embodiment 4]

The embodiment 4 relates to a method of manufacturing a semiconductor device.

The method of manufacturing a semiconductor device of the embodiment 4 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction of the embodiment 1. The first step includes: a step of preparing a semiconductor base body in which a pn junction arranged parallel to a main surface of the semiconductor base body is formed; and a step of forming trenches having a depth exceeding the pn junction from one surface of a semiconductor base body thus forming a pn junction exposure portion in the trenches, and the second step includes a step of forming the glass layer such that the glass layer directly covers the pn junction exposure portion in the inside of the trench.

FIG. 1A to FIG. 1D and FIG. 2A to FIG. 2D are views for explaining the method of manufacturing a semiconductor device of the embodiment 4. FIG. 1A to FIG. 1D and FIG. 2A to FIG. 2D are views showing respective steps of the method of manufacturing a semiconductor device.

In the method of manufacturing a semiconductor device of the embodiment 4, as shown in FIG. 1A to FIG. 1D and FIG. 2A to FIG. 2D, "semiconductor base body forming step", "trench forming step", "glass layer forming step", "photo resist forming step", "oxide film removing step", "roughened surface region forming step", "electrode forming step", and "semiconductor base body cutting step" are performed in this order. Hereinafter, the method of manufacturing a semiconductor device of the embodiment 4 is explained in the order of these steps.

(a) Semiconductor Base Body Forming Step

Firstly, a $p^+$ type diffusion layer 112 is formed by diffusion of a p type impurity from one surface of an $n^-$ type semiconductor substrate ($n^-$ type silicon substrate) 110, and an $n^+$ type diffusion layer 114 is formed by diffusion of an n type impurity from the other surface of the $n^-$ type semiconductor substrate 110 thus forming a semiconductor base body in which a pn junction arranged parallel to a main surface of the semiconductor base body is formed. Thereafter, oxide films 116, 118 are formed by thermal oxidation on a surface of the $p^+$ type diffusion layer 112 and a surface of the $n^+$ type diffusion layer 114 respectively (see FIG. 1A).

(b) Trench Forming Step

Next, predetermined opening portions are formed on the oxide film 116 at predetermined positions by photo etching. After etching the oxide film, subsequently, the semiconductor base body is etched thus forming trenches 120 having a depth exceeding the pn junction from one surface of the semiconductor base body (see FIG. 1B). Along with such formation of the trenches, a pn junction exposure portion A is formed on inner surfaces of the trenches.

(c) Glass Layer Forming Step

Figure 1C:
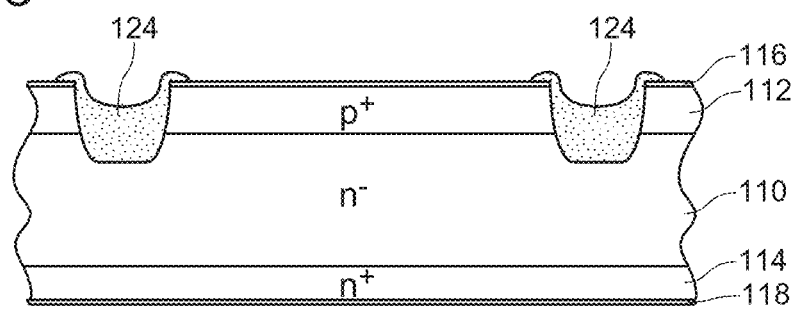

Next, a layer made of the glass composition for protecting a semiconductor junction of the embodiment 1 is formed on inner surfaces of the trenches 120 and a surface of the semiconductor base body in the vicinity of the trenches 120 by an electrophoresis method, and the layer made of the glass composition for protecting a semiconductor junction is baked so that a glass layer 124 for passivation is formed on surfaces of the trenches 120 (see FIG. 1C). Accordingly, the pn junction exposure portion in the inside of the trench 120 is brought into a state where the pn junction exposure portion is directly covered with the glass layer 124.

(d) Photo Resist Forming Step

Figure 1D:
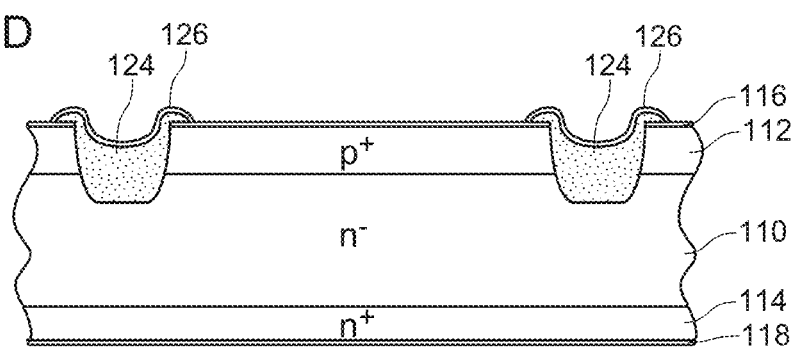

Next, a photo resist 126 is formed such that the photo resist 126 covers a surface of the glass layer 124 (see FIG. 1D).

(e) Oxide Film Removing Step

Figure 2A:
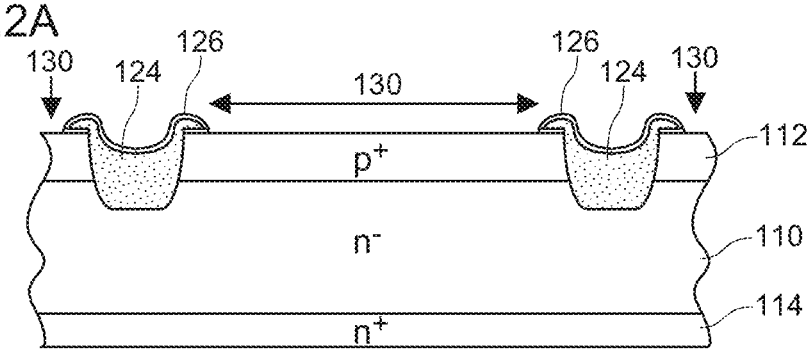
FIG. 2A to FIG. 2D are views for explaining the method of manufacturing a semiconductor device according to the embodiment 4.

Next, the oxide film 116 is etched using the photoresist 126 as a mask so that the oxide film 116 at a position 130 where an Ni plating electrode film is to be formed is removed (see FIG. 2A).

(f) Roughened Surface Region Forming Step

Figure 2B:
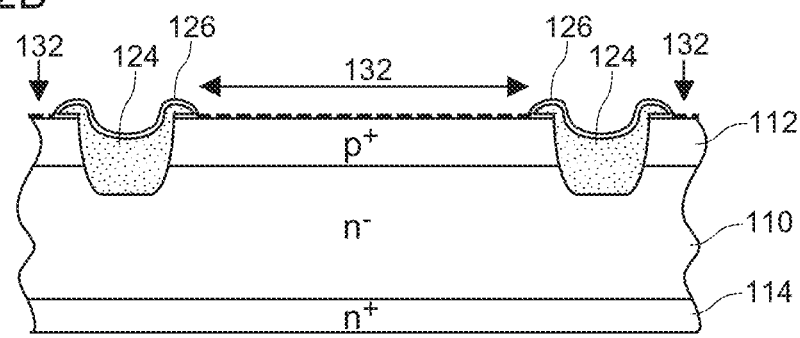

Next, a surface of the semiconductor base body at the position 130 where the Ni-plating electrode film is to be formed is subjected to surface roughening treatment thus forming a roughened surface region 132 for enhancing adhesiveness between an Ni plating electrode and the semiconductor base body (see FIG. 2B).

(g) Electrode Forming Step

Figure 2C:
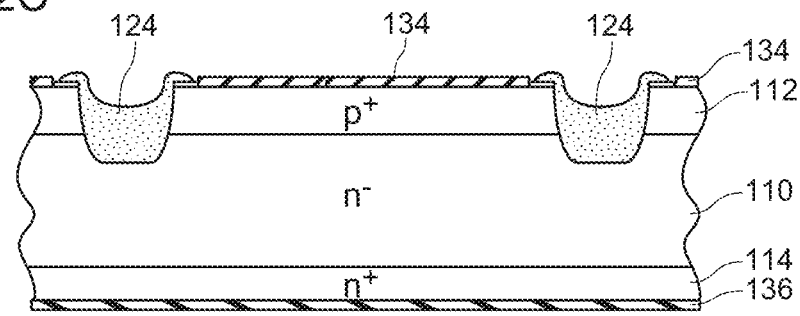

Next, Ni plating is applied to the semiconductor base body thus forming an anode electrode 134 on the roughened surface region 132 and forming a cathode electrode 136 on the other surface of the semiconductor base body (see FIG. 2C).

(h) Semiconductor Base Body Cutting Step

Figure 2D:
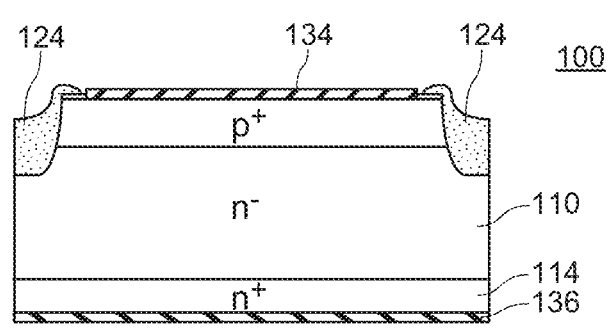

Next, the semiconductor base body is cut by dicing or the like at a center portion of the glass layer 124 thus dividing the semiconductor base body into chips whereby mesa-type semiconductor devices (pn diodes) are manufactured (see FIG. 2D).

Through the above-mentioned steps, the highly reliable mesa-type semiconductor device (semiconductor device of the embodiment 4) 100 can be manufactured.

According to the method of manufacturing a semiconductor device of the embodiment 4, the semiconductor device is manufactured using the glass composition for protecting a semiconductor junction of the embodiment 1 and hence, a highly reliable semiconductor device can be manufactured by using a glass material which contains no lead in the same manner as the conventional case where "a glass material containing lead silicate as a main component" is used.

The method of manufacturing a semiconductor device of the embodiment 4 manufactures a semiconductor device using the glass composition for protecting a semiconductor junction of the embodiment 1. Accordingly, out of the advantageous effects which the glass composition for protecting a semiconductor junction of the embodiment 1 acquires, the semiconductor device which is manufactured by the method of manufacturing a semiconductor device of the embodiment 4 acquires the exactly same advantageous effects as the glass composition for protecting a semiconductor junction of the embodiment 1 with respect to the constitutional features of the embodiment 4 which are equal to the constitutional features of the embodiment 1.

[Embodiment 5]

The embodiment 5 relates to a method of manufacturing a semiconductor device.

In the same manner as the method of manufacturing a semiconductor device of the embodiment 4, the method of manufacturing a semiconductor device of the embodiment 5 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed by using the glass composition for protecting a semiconductor junction of the embodiment 1. However, different from the method of manufacturing a semiconductor device of the embodiment 4, in the method of manufacturing a semiconductor device of the embodiment 5, the first step includes a step of forming the pn junction exposure portion on a surface of the semiconductor base body, and the second step includes a step of forming the glass layer such that the glass layer directly covers the pn junction exposure portion on the surface of the semiconductor base body.

FIG. 3A to FIG. 3C and FIG. 4A to FIG. 4C are views for explaining a method of manufacturing a semiconductor device of the embodiment 5. That is, FIG. 3A to FIG. 3C and FIG. 4A to FIG. 4C are views showing respective steps of the method of manufacturing a semiconductor device.

In the method of manufacturing the semiconductor device of the embodiment 5, as shown in FIG. 3A to FIG. 3C and FIG. 4A to FIG. 4C, "semiconductor base body preparing step", "$p^+$ type diffusion layer forming step", "$n^+$ type diffusion layer forming step", "glass layer forming step", "glass layer etching step" and "electrode forming step" are performed in this order. Hereinafter, the method of manufacturing a semiconductor device of the embodiment 5 is explained in the order of these steps.

(a) Semiconductor Base Body Preparing Step

Figure 3A:
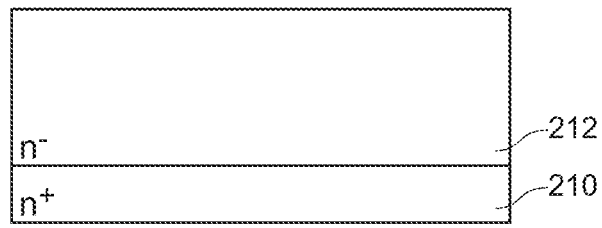
FIG. 3A to FIG. 3C are views for explaining a method of manufacturing a semiconductor device according to an embodiment 5.
Figure 3B:
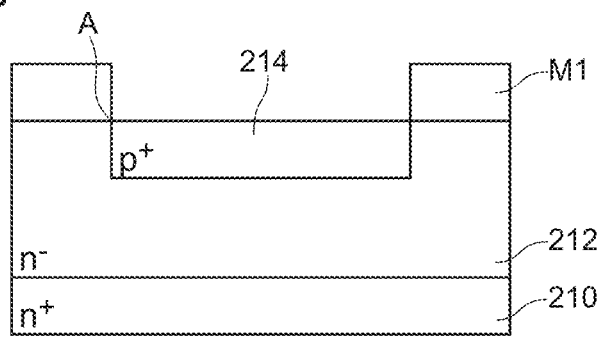
Figure 3C:
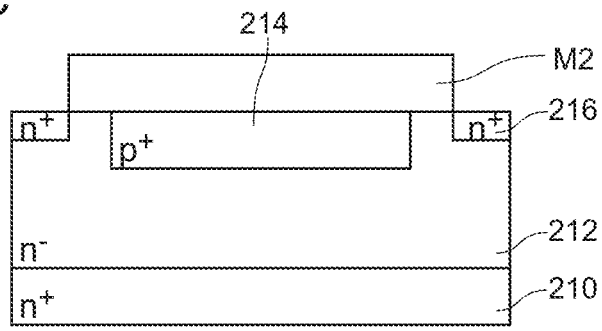

Firstly, a semiconductor base body where an $n^-$ type epitaxial layer 212 is laminated on an $n^+$ type silicon substrate 210 is prepared (see FIG. 3A).

(b) p⁺ Type Diffusion Layer Forming Step

Next, after forming a mask M1 on the n⁻ type epitaxial layer 212, a p type impurity (boron ion, for example) is injected into a predetermined region on a surface of the n⁻ type epitaxial layer 212 by an ion implantation method using the mask M1. Then, a p⁺ type diffusion layer 214 is formed by thermal diffusion (see FIG. 3B). In this step, a pn junction exposure portion A is formed on a surface of the semiconductor base body.

(c) n⁺ Type Diffusion Layer Forming Step

Next, the mask M1 is removed from the n⁻ type epitaxial layer 212 and a mask M2 is formed on the n⁻ type epitaxial layer 212. Thereafter, an n type impurity (arsenic ion, for example) is injected into a predetermined region on the surface of the n⁻ type epitaxial layer 212 by an ion implantation method using the mask M2. Then, an n⁺ type diffusion layer 216 is formed by thermal diffusion (see FIG. 3C).

(d) Glass Layer Forming Step

Next, the mask M2 is removed from the n⁻ type epitaxial layer 212. Thereafter, a layer made of the glass composition for protecting a semiconductor junction of the embodiment 1 is formed on the surface of the n⁻ type epitaxial layer 212 by a spin coating method and, then, the layer made of the glass composition for protecting a semiconductor junction is baked thus forming a glass layer 220 for passivation (see FIG. 4A).

(e) Glass Layer Etching Step

Figure 4A:
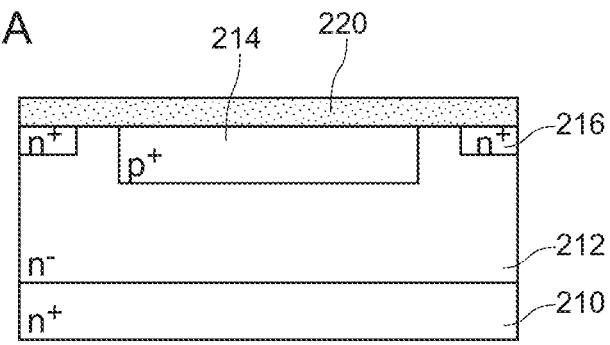
FIG. 4A to FIG. 4C are views for explaining the method of manufacturing a semiconductor device according to the embodiment 5.
Figure 4B:
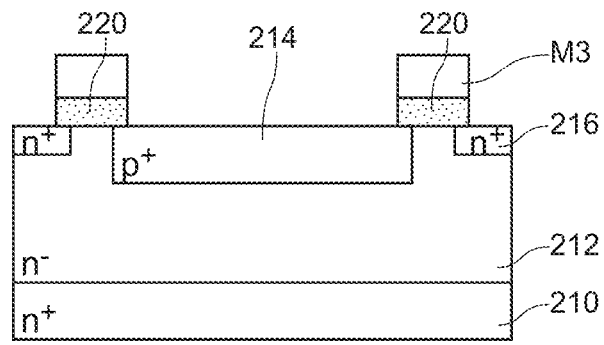

Next, a mask M3 is formed on a surface of the glass layer 220 and, thereafter, the glass layer 220 is etched (see FIG. 4B. Due to such etching, a glass layer 220 is formed on a predetermined region on the surface of the n⁻ type epitaxial layer 212.

(f) Electrode Forming Step

Figure 4C:
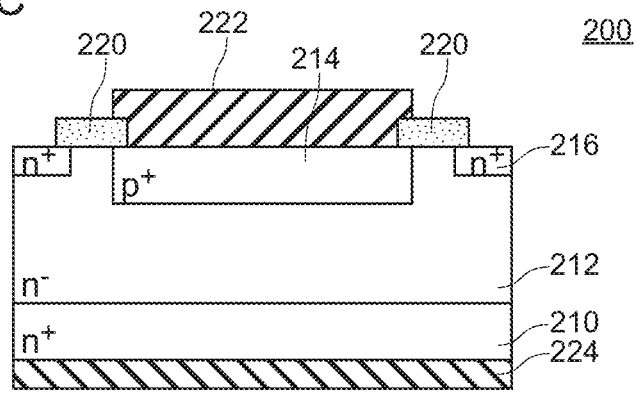

Next, the mask M3 is removed from the surface of the glass layer 220 and, thereafter, an anode electrode 222 is formed on a region of the surface of the semiconductor base body surrounded by the glass layer 220, and a cathode electrode 224 is formed on a back surface of the semiconductor base body (see FIG. 4C).

Through the above-mentioned steps, a highly reliable planar-type semiconductor device (the semiconductor device of the embodiment 5) 200 can be manufactured.

The method of manufacturing a semiconductor device of the embodiment 5 is substantially equal to the method of manufacturing a semiconductor device of the embodiment 4 except for the constitution that the method of manufacturing a semiconductor device of the embodiment 5 manufactures the planar-type semiconductor device. Accordingly, out of the advantageous effects which the method of manufacturing a semiconductor device of the embodiment 4 acquires, the method of manufacturing a semiconductor device of the embodiment 5 acquires the exactly same advantageous effects as the method of manufacturing a semiconductor device of the embodiment 4 with respect to the constitutional features of the embodiment 5 which are equal to the constitutional features of the embodiment 4.

[Embodiment 6]

In the same manner as the method of manufacturing a semiconductor device of the embodiment 4, the method of manufacturing a semiconductor device of the embodiment 6 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction of the embodiment 1. However, different from the method of manufacturing a semiconductor device of the embodiment 4, in the method of manufacturing a semiconductor device of the embodiment 6, the second step includes: a step of forming an insulation layer on the pn junction exposure portion in the trench; and a step of forming the glass layer such that the glass layer covers the pn junction exposure portion with the insulation layer interposed therebetween. In the method of manufacturing a semiconductor device of the embodiment 6, a mesa-type pn diode is manufactured as the semiconductor device.

FIG. 5A to FIG. 5D and FIG. 6A to FIG. 6D are views for explaining the method of manufacturing a semiconductor device of the embodiment 6. FIG. 5A to FIG. 5D and FIG. 6A to FIG. 6D are views showing respective steps of the method of manufacturing a semiconductor device.

In the method of manufacturing a semiconductor device of the embodiment 6, as shown in FIG. 5A to FIG. 5D and FIG. 6A to FIG. 6D, "semiconductor base body forming step", "trench forming step", "insulation layer forming step", "glass layer forming step", "photo resist forming step", "oxide film removing step", "roughened surface region forming step", "electrode forming step", and "semiconductor base body cutting step" are performed in this order. Hereinafter, the method of manufacturing a semiconductor device of the embodiment 6 is explained in the order of these steps.

(a) Semiconductor Base Body Forming Step

Firstly, a p⁺ type diffusion layer 112 is formed by diffusion of a p type impurity from one surface of an n⁻ type semiconductor substrate (n⁻ type silicon substrate) 110, and an n⁺ type diffusion layer 114 is formed by diffusion of an n type impurity from the other surface of the n⁻ type semiconductor substrate 110 thus forming a semiconductor base body in which a pn junction arranged parallel to a main surface of the semiconductor base body is formed. Thereafter, oxide films 116, 118 are formed by thermal oxidation on a surface of the p⁺ type diffusion layer 112 and a surface of the n⁺ type diffusion layer 114 respectively (see FIG. 5A).

(b) Trench Forming Step

Next, predetermined opening portions are formed on the oxide film 116 at predetermined positions by photo etching. After etching the oxide film, subsequently, the semiconductor base body is etched thus forming trenches 120 having a depth exceeding the pn junction from one surface of the semiconductor base body (see FIG. 5B). Along with such formation of the trenches, a pn junction exposure portion A is formed on an inner surfaces of the trench.

(c) Insulation Layer Forming Step

Figure 5A:
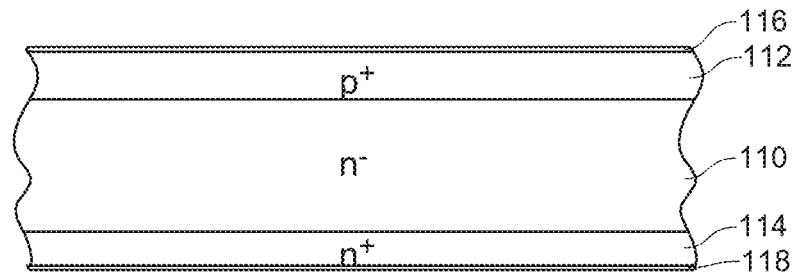
FIG. 5A to FIG. 5D are views for explaining a method of manufacturing a semiconductor device according to an embodiment 6.
Figure 5B:
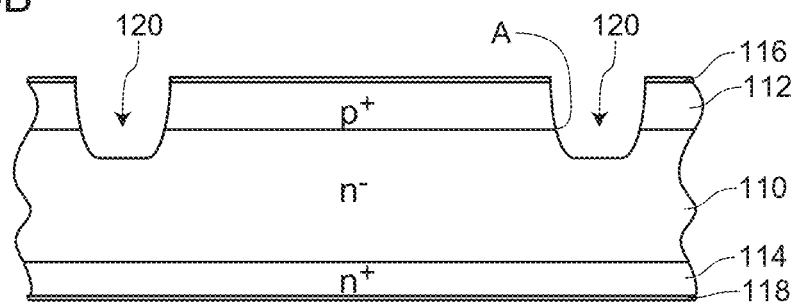
Figure 5C:
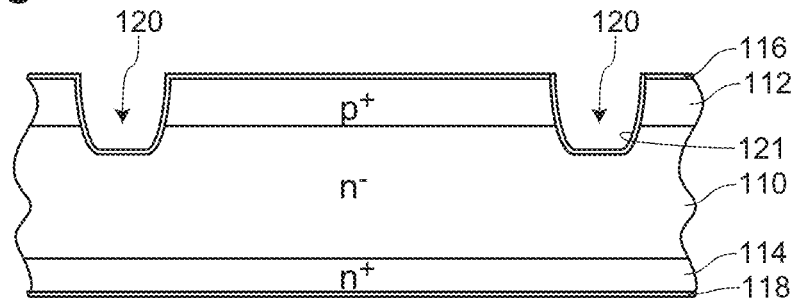

Next, an insulation layer 121 formed of a silicon oxide film is formed on inner surfaces of the trenches 120 by a thermal oxidation method using dry oxygen (DryO₂) (see FIG. 5C). A thickness of the insulation layer 121 is set to a value which falls within a range of 5 nm to 60 nm (20 nm, for example). The insulation layer is formed such that a semiconductor base body is introduced into a diffusion furnace and, thereafter, thermal oxidation treatment is performed at a temperature of 900° C. for 10 minutes while supplying an oxygen gas into the diffusion furnace. When the thickness of the insulation layer 121 is less than 5 nm, there may be a case where a reverse current reduction effect cannot be acquired. On the other hand, when the thickness of the insulation layer 121 exceeds 60 nm, there may be a case where a layer made of a glass composition cannot be formed by an electrophoresis method in a next glass layer forming step.

(d) Glass Layer Forming Step

Figure 5D:
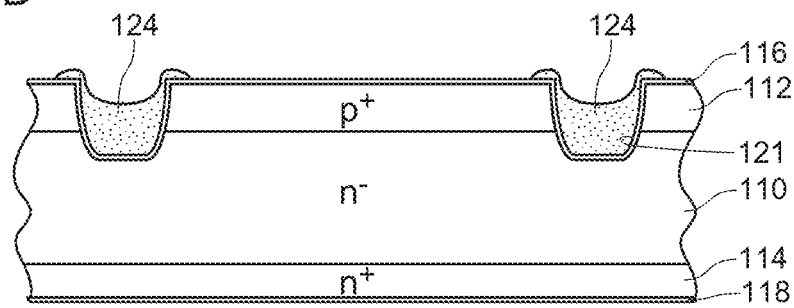

Next, a layer made of the glass composition for protecting a semiconductor junction of the embodiment 1 is formed on inner surfaces of the trenches 120 and a surface of the semiconductor base body in the vicinity of the trenches 120 by an electrophoresis method and, then, the layer made of the glass composition for protecting a semiconductor junction is baked thus forming a glass layer 124 for passivation (see FIG. 5D). In forming the layer made of the glass composition for protecting a semiconductor junction on the inner surfaces of the trenches 120, the glass layer 124 is formed such that the glass layer 124 covers the inner surfaces of the trenches 120 with an insulation layer 121 interposed therebetween. Accordingly, the pn junction exposure portion in the trench 120 is brought into a state where the pn junction exposure portion is covered with the glass layer 124 with the insulation layer 121 interposed therebetween.

(e) Oxide Film Removing Step

Figure 6A:
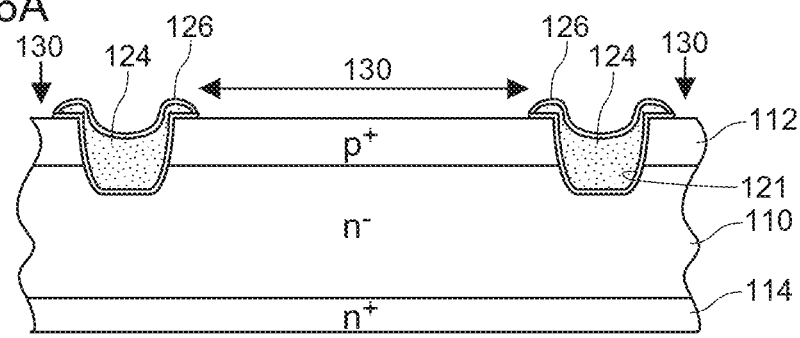
FIG. 6A to FIG. 6D are views for explaining the method of manufacturing a semiconductor device according to the embodiment 6.

Next, a photo resist 126 is formed such that the photo resist 126 covers the surface of the glass layer 124 and, thereafter, the oxide film 116 is etched using the photo resist 126 as a mask so that the oxide film 116 formed at a position 130 where an Ni plating electrode film is to be formed is removed (see FIG. 6A).

(f) Roughened Surface Region Forming Step

Figure 6B:
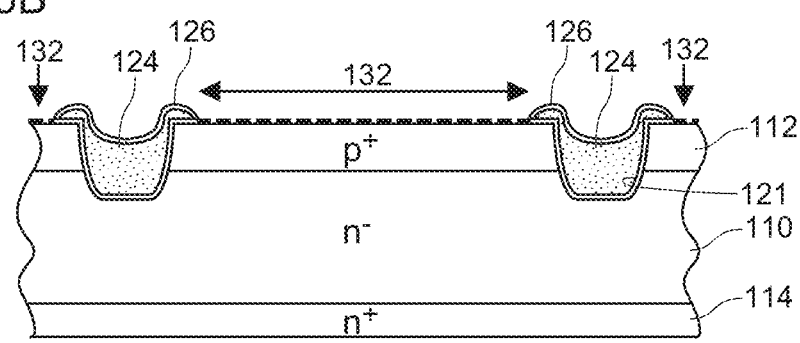

Next, a surface of the semiconductor base body at the position 130 where the Ni-plating electrode film is to be formed is subjected to surface roughening treatment thus forming a roughened surface region 132 for enhancing adhesiveness between an Ni plating electrode and the semiconductor base body (see FIG. 6B).

(g) Electrode Forming Step

Figure 6C:
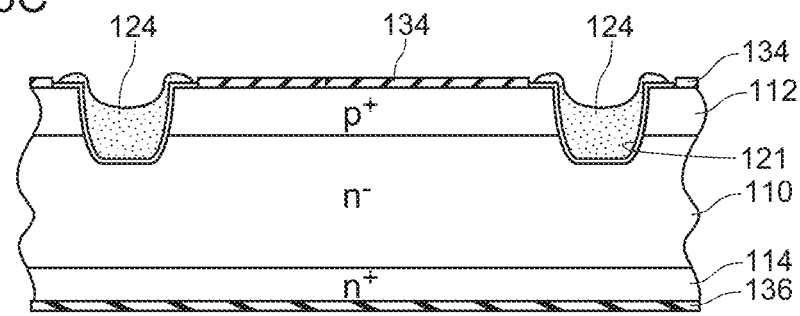

Next, Ni plating is applied to the semiconductor base body thus forming an anode electrode 134 on the roughened surface region 132 and forming a cathode electrode 136 on the other surface of the semiconductor base body (see FIG. 6C).

(h) Semiconductor Base Body Cutting Step

Figure 6D:
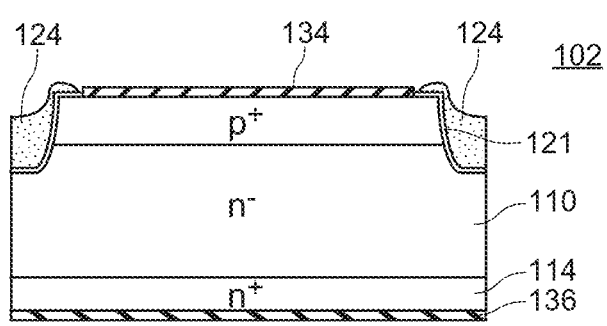

Next, the semiconductor base body is cut by dicing or the like at a center portion of each glass layer 124 thus dividing the semiconductor base body into chips whereby semiconductor devices (mesa-type pn diodes) 102 are manufactured (see FIG. 6D).

Through the above-mentioned steps, the highly reliable mesa-type semiconductor device (semiconductor device of the embodiment 6) 102 can be manufactured.

According to the method of manufacturing a semiconductor device of the embodiment 6, the semiconductor device is manufactured using the glass composition for protecting a semiconductor junction of the embodiment 1 in the same manner as the method of manufacturing a semiconductor device of the embodiment 4. Accordingly, a highly reliable semiconductor device can be manufactured by using a glass material which contains no lead in the same manner as the conventional case where "a glass material containing lead silicate as a main component" is used.

Further, according to the method of manufacturing a semiconductor device of the embodiment 6, the insulation layer 121 is interposed between the semiconductor base body and the glass layer 124. Accordingly, the insulation property of the semiconductor device is enhanced. Further, the semiconductor device is hardly influenced by the composition of the glass layer or the glass baking condition and hence, a semiconductor device with a low reverse current can be manufactured in a stable manner.

Further, the method of manufacturing a semiconductor device of the embodiment 6 can also acquire the following advantageous effect. That is, when a resin-sealed semiconductor device is fabricated by molding a semiconductor device obtained by the method of manufacturing a semiconductor device of the embodiment 6 with a resin, such a resin-sealed semiconductor device can exhibit higher resistance to a reverse bias at a high temperature than a resin-sealed semiconductor device which is fabricated by molding a semiconductor device with a resin using a conventional "glass material containing lead silicate as a main component".

Further, according to the method of manufacturing a semiconductor device of the embodiment 6, the glass layer 124 is brought into contact with the insulation layer 121 having higher wettability than the semiconductor base body and hence, bubbles are hardly generated from an interface between the semiconductor base body and the glass layer in a process of forming the glass layer by baking the layer made of the glass composition. Accordingly, it is possible to suppress the generation of such bubbles without adding a component having a defoaming action such as nickel oxide or with a small amount (for example, 2.0 mol % or less) of such a component even when the component is added.

The method of manufacturing a semiconductor device of the embodiment 6 is substantially equal to the method of manufacturing a semiconductor device of the embodiment 4 except for that the second step includes: the step of forming an insulation layer on the pn junction exposure portion in the trench; and the step of forming the glass layer such that the glass layer covers the pn junction exposure portion with the insulation layer interposed therebetween. Accordingly, out of the advantageous effects which the method of manufacturing a semiconductor device of the embodiment 4 acquires, the method of manufacturing a semiconductor device of the embodiment 6 acquires the exactly same advantageous effects as the method of manufacturing a semiconductor device of the embodiment 4 with respect to the constitutional features of the embodiment 6 which are equal to the constitutional features of the embodiment 4.

[Embodiment 7]

In the same manner as the method of manufacturing a semiconductor device of the embodiment 5, the method of manufacturing a semiconductor device of the embodiment 7 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction of the embodiment 1. However, different from the method of manufacturing a semiconductor device of the embodiment 5, in the method of manufacturing a semiconductor device of the embodiment 7, the second step includes: a step of forming an insulation layer on the pn junction exposure portion in a semiconductor element; and a step of forming the glass layer such that the glass layer covers the pn junction exposure portion with the insulation layer interposed therebetween. In the method of manufacturing a semiconductor device of the embodiment 7, a planar-type pn diode is manufactured as the semiconductor device.

FIG. 7A to FIG. 7D and FIG. 8A to FIG. 8D are views for explaining the method of manufacturing a semiconductor device of the embodiment 7. FIG. 7A to FIG. 7D and FIG. 8A to FIG. 8D are views showing respective steps of the method of manufacturing a semiconductor device.

In the method of manufacturing a semiconductor device of the embodiment 7, as shown in FIG. 7A to FIG. 7D and FIG. 8A to FIG. 8D, "semiconductor base body preparing step", "$p^+$ type diffusion layer forming step", "$n^+$ type diffusion layer forming step", "insulation layer forming step", "glass layer forming step", "etching step" and "electrode forming step" are performed in this order. Hereinafter, the method of manufacturing a semiconductor device of the embodiment 7 is explained in the order of these steps.

(a) Semiconductor Base Body Preparing Step

Figure 7A:
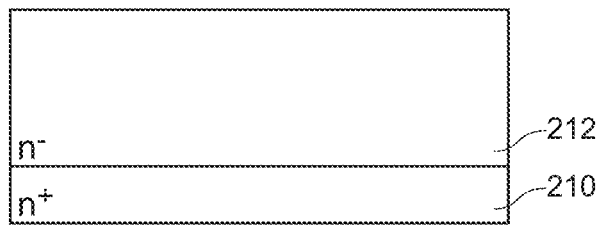
FIG. 7A to FIG. 7D are views for explaining a method of manufacturing a semiconductor device according to an embodiment 7.
Figure 7B:
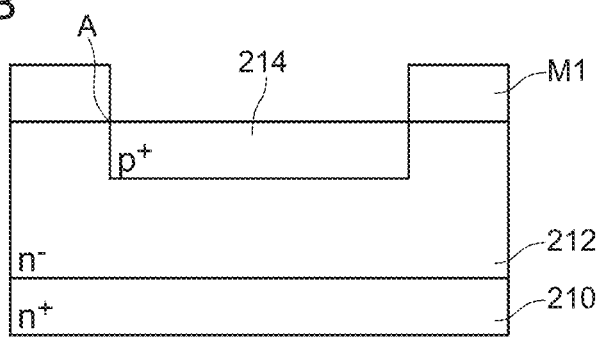
Figure 7C:
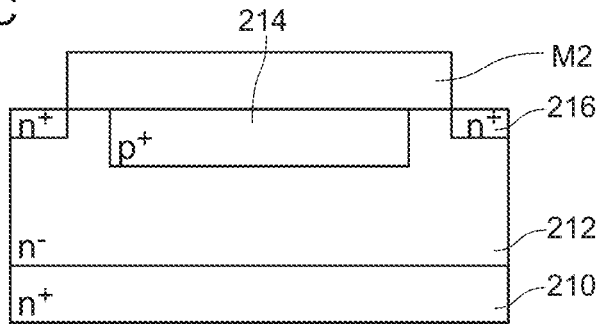
Figure 7D:
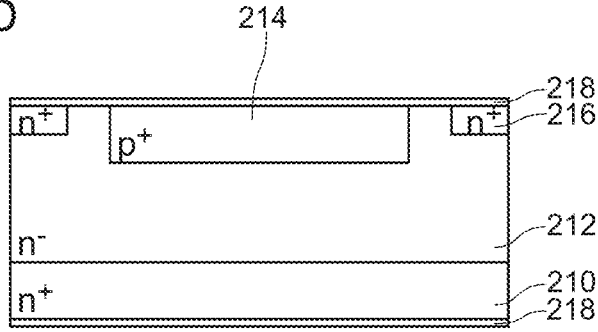

Firstly, a semiconductor base body where an n⁻ type epitaxial layer 212 is laminated on an n⁺ type silicon substrate 210 is prepared (see FIG. 7A).

(b) p⁺ Type Diffusion Layer Forming Step

Next, after forming a mask M1 on the n⁻ type epitaxial layer 212, a p type impurity (boron ion, for example) is injected into a predetermined region on a surface of the n⁻ type epitaxial layer 212 by an ion implantation method using the mask M1. Then, a p⁺ type diffusion layer 214 is formed by thermal diffusion (see FIG. 7B). In this step, a pn junction exposure portion A is formed on a surface of the semiconductor base body.

(c) n⁺ Type Diffusion Layer Forming Step

Next, the mask M1 is removed from the n⁻ type epitaxial layer 212 and a mask M2 is formed on the n⁻ type epitaxial layer 212. Thereafter, an n type impurity (arsenic ion, for example) is injected into a predetermined region on the surface of the n⁻ type epitaxial layer 212 by an ion implantation method using the mask M2. Then, an n⁺ type diffusion layer 216 is formed by thermal diffusion (see FIG. 7C).

(d) Insulation Layer Forming Step

Next, the mask M2 is removed from the n⁻ type epitaxial layer 212. Thereafter, an insulation layer 218 formed of a silicon oxide film is formed on the surface of the n⁻ type epitaxial layer 212 (and on a back surface of the n⁺ type silicon substrate 210) by a thermal oxidation method using dry oxygen (DryO₂) (see FIG. 7D). A thickness of the insulation layer 218 is set to a value which falls within a range of 5 nm to 60 nm (20 nm, for example). The insulation layer 218 is formed such that a semiconductor base body is introduced into a diffusion furnace and, thereafter, thermal oxidation treatment is applied to the semiconductor base body at a temperature of 900° C. for 10 minutes while supplying an oxygen gas into the diffusion furnace. When the thickness of the insulation layer 218 is less than 5 nm, there may be a case where a reverse current reduction effect cannot be acquired. On the other hand, when the thickness of the insulation layer 218 exceeds 60 nm, there may be a case where a layer made of the glass composition cannot be formed by an electrophoresis method in the next glass layer forming step.

(e) Glass Layer Forming Step

Figure 8A:
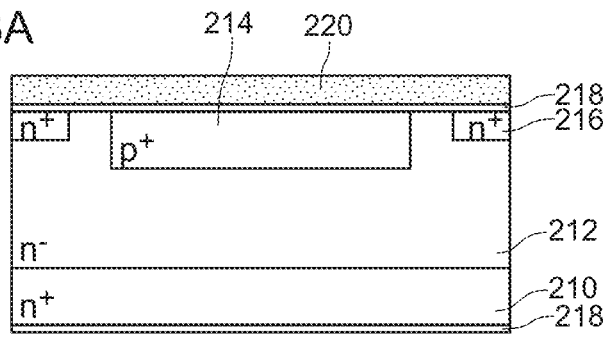
FIG. 8A to FIG. 8D are views for explaining a method of manufacturing a semiconductor device according to an embodiment 8.

Next, a layer made of the glass composition for protecting a semiconductor junction of the embodiment 1 is formed on a surface of the insulation layer 218 by an electrophoresis method and, then, the layer made of the glass composition for protecting a semiconductor junction is baked thus forming a glass layer 220 for passivation (see FIG. 8A).

(f) Etching Step

Figure 8B:
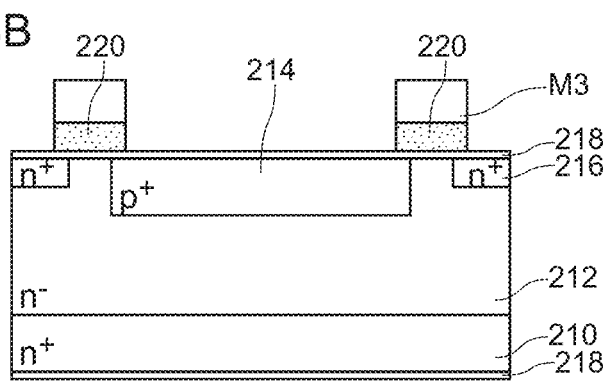
Figure 8C:
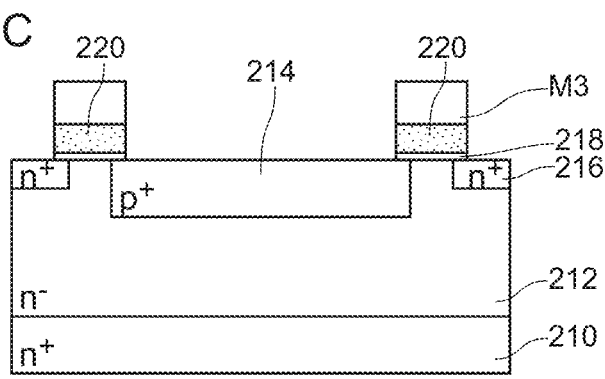

Next, after forming a mask M3 on the surface of the glass layer 220, the glass layer 220 is etched (see FIG. 8B). Subsequently, the insulation layer 218 is etched (see FIG. 8C). Due to such etching, the insulation layer 218 and the glass layer 220 are formed on a predetermined region on the surface of the n⁻ type epitaxial layer 212.

(g) Electrode Forming Step

Figure 8D:
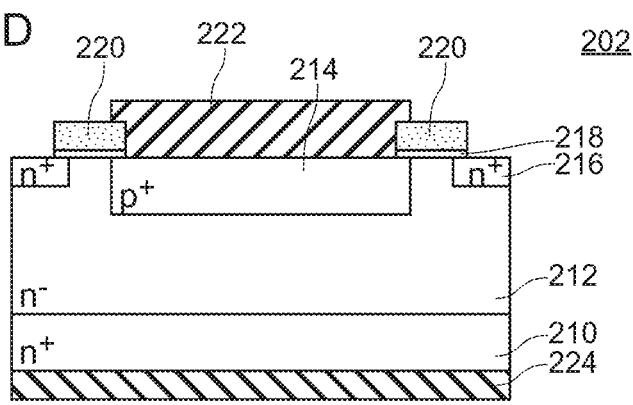

Next, the mask M3 is removed from the surface of the glass layer 220 and, thereafter, an anode electrode 222 is formed on a region of the surface of the semiconductor base body surrounded by the glass layer 220, and a cathode electrode 224 is formed on a back surface of the semiconductor base body (see FIG. 8D).

(h) Semiconductor Base Body Cutting Step

Next, the semiconductor base body is cut by dicing or the like thus dividing the semiconductor base body into chips whereby the semiconductor devices (planar-type pn diodes) 202 are manufactured.

Through the above-mentioned steps, a highly reliable planar-type semiconductor device (the semiconductor device of the embodiment 7) 202 can be manufactured.

According to the method of manufacturing a semiconductor device of the embodiment 7, in the same manner as the method of manufacturing a semiconductor device of the embodiment 5, the semiconductor device is manufactured using the glass composition for protecting a semiconductor junction of the embodiment 1. Accordingly, a highly reliable semiconductor device can be manufactured by using a glass material which contains no lead in the same manner as a conventional method where a semiconductor device is manufactured using "a glass material containing lead silicate as a main component".

Further, according to the method of manufacturing a semiconductor device of the embodiment 7, the insulation layer 218 is interposed between the semiconductor base body and the glass layer 220. Accordingly, the insulation property of the semiconductor device is enhanced and the semiconductor device is hardly influenced by the composition of the glass layer or the glass baking condition and hence, a semiconductor device with a low reverse current can be manufactured in a stable manner.

Further, the method of manufacturing a semiconductor device of the embodiment 7 can acquire the following advantageous effect. That is, when a resin-sealed semiconductor device is fabricated by molding a semiconductor device obtained by the method of manufacturing a semiconductor device of the embodiment 7 with a resin, such a resin-sealed semiconductor device can exhibit higher resistance to a reverse bias at a high temperature than a resin-sealed semiconductor device which is fabricated by molding a semiconductor device by a resin using a conventional "glass material containing lead silicate as a main component".

Further, according to the method of manufacturing a semiconductor device of the embodiment 7, the glass layer 220 is brought into contact with the insulation layer 218 having higher wettability than the semiconductor base body and hence, bubbles are hardly generated from an interface between the semiconductor base body and the glass layer in the step of forming the glass layer by baking the layer made of the glass composition. Accordingly, it is possible to suppress the generation of such bubbles without adding a component having a defoaming action such as nickel oxide or with a small amount (for example, 2.0 mol % or less) of such a component even when the component is added.

The method of manufacturing a semiconductor device of the embodiment 7 is substantially equal to the method of manufacturing a semiconductor device of the embodiment 5 except for that the second step includes: the step of forming an insulation layer on the pn junction exposure portion in a semiconductor element; and the step of forming the glass layer such that the glass layer covers the pn junction exposure portion with the insulation layer interposed therebetween. Accordingly, out of the advantageous effects which the method of manufacturing a semiconductor device of the embodiment 5 acquires, the method of manufacturing a semiconductor device of the embodiment 7 acquires the exactly same advantageous effects as the method of manufacturing a semiconductor device of the embodiment 5 with respect to the constitutional features of the embodiment 7 which are equal to the constitutional features of the embodiment 5.

EXAMPLES

1. Preparation of Specimens

FIG. 9 is a Table showing conditions and results of examples. Raw materials are prepared at composition ratios indicated in examples 1 to 5 and comparison examples 1 to 9 (see FIG. 9). The raw materials are sufficiently mixed and stirred together by a mixer and, thereafter, the mixed raw material is put into a platinum crucible and is melted in an electric furnace by elevating the temperature to a predetermined temperature (1350° C. to 1550° C.) and holding the temperature for two hours. Then, the material in a molten state is made to flow out from the crucible and is fed to water-cooled rolls so that glass flakes in a flaky shape are obtained. The glass flakes are pulverized by a ball mill until the glass flakes obtain an average particle size of 5 μm thus obtaining powdery glass composition.

The raw materials used in the examples are $SiO_2$, $H_3BO_3$, $Al_2O_3$, ZnO, $CaCO_3$, $BaCO_3$, MgO, NiO, $ZrO_2$ and PbO.

2. Evaluation

The respective glass compositions obtained by the above-mentioned methods are evaluated in accordance with the following evaluation aspects.

(1) Evaluation Aspect 1 (Environmental Burden)

The object of the present invention lies in that "a highly reliable semiconductor device can be manufactured by using a glass material which contains no lead in the same manner as the conventional case where "a glass material containing lead silicate as a main component" is used" and hence, the score "good" is given when the glass composition contains no lead component, and the score "bad" is given when the glass composition contains a lead component.

(2) Evaluation Aspect 2 (Baking Temperature)

When the baking temperature is excessively high, the baking temperature largely influences a semiconductor device in a manufacturing process. Accordingly, the score "good" is given when the baking temperature is equal to or below 1000° C., and the score "bad" is given when the baking temperature exceeds 1000° C. In columns of the evaluation aspect 2 in FIG. 9, numerals in parentheses indicate baking temperatures.

(3) Evaluation Aspect 3 (Resistance to Chemicals)

The score "good" is given when the glass composition exhibits insolubility with respect to a fluoric acid, and the score "bad" is given when the glass composition exhibits solubility to a fluoric acid. A test for evaluating whether or not the glass composition exhibits insolubility to a fluoric acid is carried out using the following two test methods (test methods 1 and 2).

(3-1) Test Method 1

Glass layers are formed on surfaces of mirror-finished silicon wafers by an electrophoresis method using the respective glass compositions. After baking, the silicon wafer is divided by cutting into specimens having a size of 10 mm×10 mm. Thereafter, each specimen is immersed in fluoride acid solution (6%) for 5 minutes, and a change in weight of the specimen before and after immersion is measured. As the result, the score "good" is given when a change in weight of the specimen is equal to or less than 2.0 mg, and the score "bad" is given when a change in weight of the specimen exceeds 2.0 mg.

(3-2) Test Method 2

Glass layers are formed on surfaces of mirror-finished silicon wafers by an electrophoresis method using the respective glass compositions. After baking, the silicon wafer is divided by cutting into samples having a size of 10 mm×10 mm. Thereafter, a resist having an opening of 4 mmϕ is formed on the surface of the sample on which the glass layer is formed thus preparing specimens. Then, each specimen is immersed in fluoride acid solution (6%) for 5 minutes and, thereafter, a resist is removed. Then, a height of step between an etched section and a non-etched section (at 4 positions) is measured using a focus depth method. FIG. 10 is a photograph showing the height of step between the etched section and the non-etched section. As the result, the score "good" is given when the average value of heights of steps at 4 measured positions is 6.0 μm or less, and the score "bad" is given when the average value of heights of steps at 4 measured positions exceeds 6.0 μm.

(3-3) Comprehensive Evaluation in Evaluation Aspect 3

The score "good" is given in the comprehensive evaluation when the score "good" is given with respect to all items to be evaluated in both test methods 1 and 2. The score "bad" is given in the comprehensive evaluation when the score "bad" is given with respect to at least one of the test methods 1 and 2. FIG. 11 shows the results of the test methods 1 and 2. As can be understood from FIG. 9, the glass compositions for protecting a semiconductor junction according to comparison examples 7 to 9 are crystallized in the process of vitrification and hence, the evaluation in the evaluation aspect 3 cannot be carried out. Accordingly, "−" is described in the columns of the evaluation aspect 3 in FIG. 9.

(4) Evaluation Aspect 4 (Average Linear Expansion Coefficient)

Glass plates in a flaky shape are prepared from a material in a molten state obtained in the above-mentioned "1. Preparation of samples", and an average linear expansion coefficient of the glass composition at a temperature of 50° C. to 550° C. is measured by using the glass plates in a flaky shape. The average linear expansion coefficient is measured by a total expansion measuring method (temperature elevation speed: 10° C./min) using Thermomechanical Analyzers TMA-60 made by SHIMADZU CORP where silicon single crystal having a length of 20 mm is used as a standard sample. As the result of the measurement, the score "good" is given when the average linear expansion coefficient at a temperature of 50° C. to 550° C. is equal to or below $4.5 \times 10^{-6}$, and the score "bad" is given when the average linear expansion coefficient exceeds $4.5 \times 10^{-6}$. In the column of the evaluation aspect 4 in FIG. 9, numerals in parentheses indicate average linear expansion coefficient of the glass composition within a temperature range of 50° C. to 550° C.×$10^{+6}$. A linear expansion coefficient of silicon is $3.73 \times 10^{-6}$.

(5) Evaluation Aspect 5 (Insulation Property)

Figure 12A:
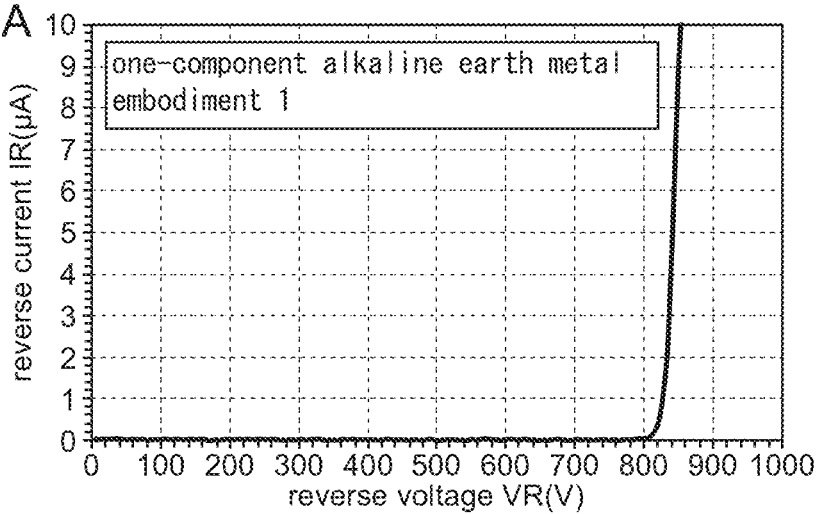
FIG. 12A to FIG. 12C are views showing a reverse breakdown voltage characteristic of the semiconductor device.
Figure 12B:
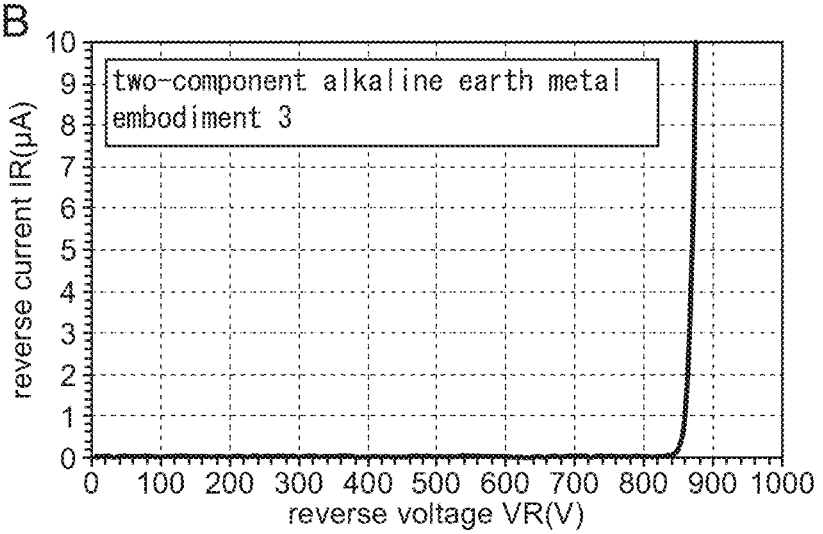
Figure 12C:
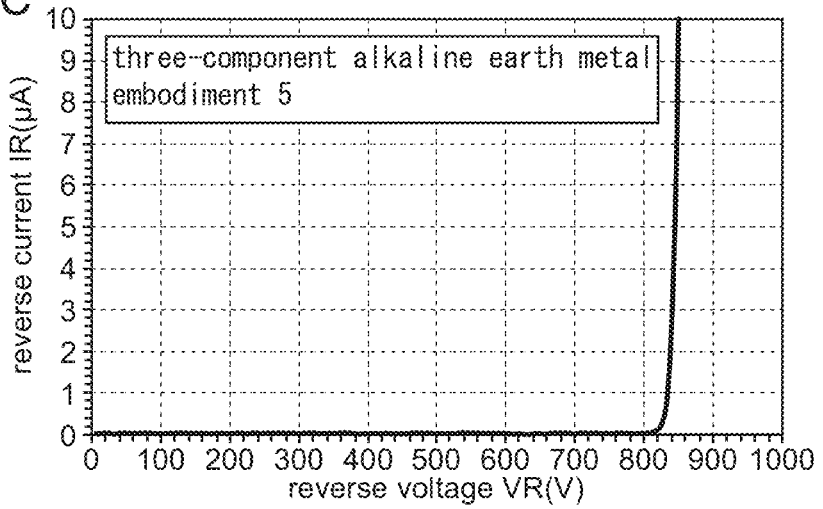
Figure 15A:
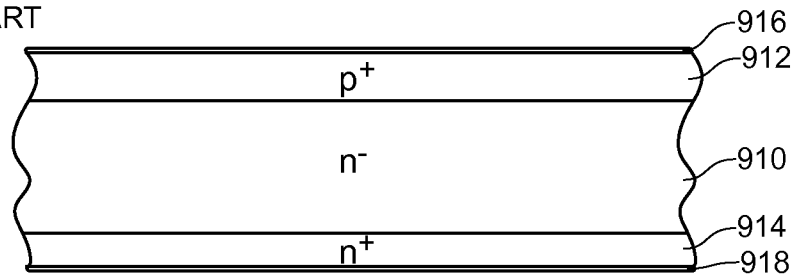
FIG. 15A to FIG. 15D are views for explaining a conventional method of manufacturing a semiconductor device.
Figure 15B:
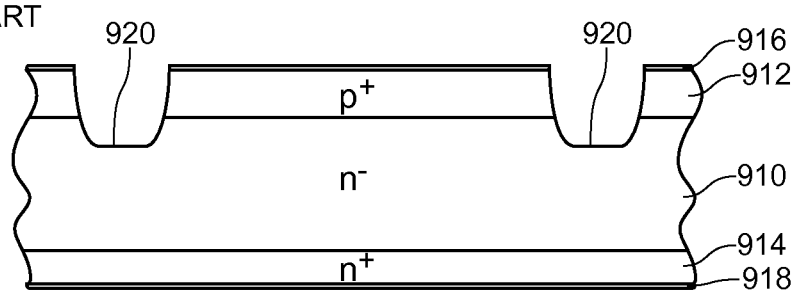
Figure 15C:
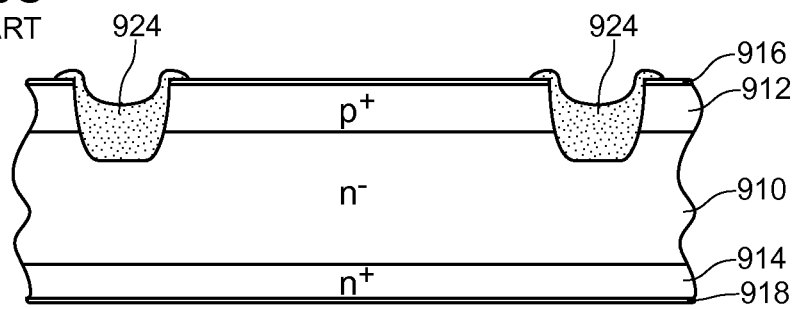
Figure 15D:
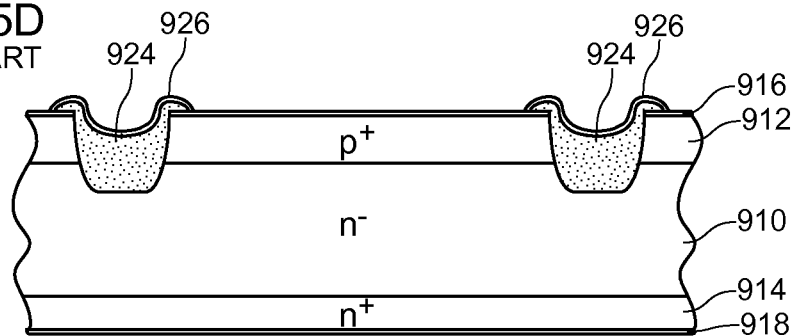
Figure 16A:
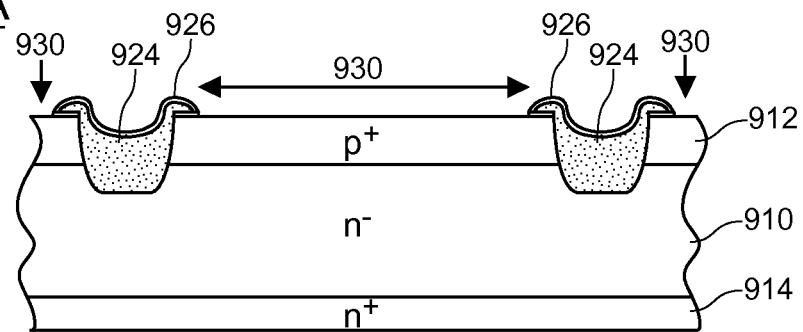
FIG. 16A to FIG. 16D are views for explaining a conventional method of manufacturing a semiconductor device.
Figure 16B:
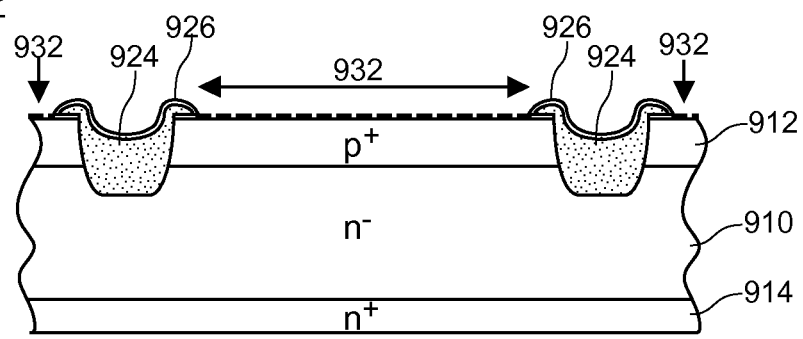
Figure 16C:
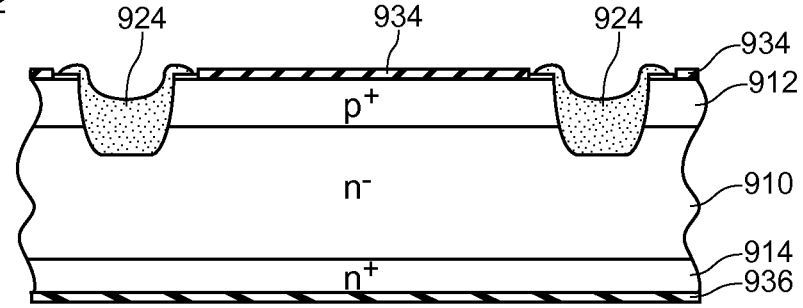
Figure 16D:
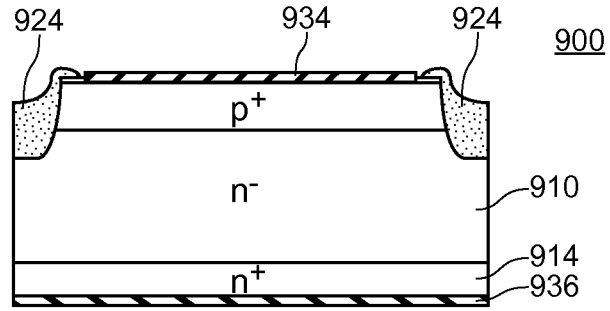

A semiconductor device (pn diodes) which has a breakdown voltage strength of 600V class is manufactured by a method substantially equal to the method of manufacturing a semiconductor device of the embodiment 6, and a reverse breakdown voltage characteristic of a semiconductor device manufactured by the method is measured. FIG. 12A to FIG. 12C are graphs showing reverse breakdown voltage characteristics of semiconductor devices. FIG. 12A is the graph showing a reverse breakdown voltage characteristic of a semiconductor device manufactured using the glass composition for protecting a semiconductor junction according to the Example 1. FIG. 12B is a graph showing a reverse breakdown voltage characteristic of a semiconductor device manufactured using the glass composition for protecting a semiconductor junction according to the example 3. FIG. 12C is a graph showing a reverse breakdown voltage characteristic of a semiconductor device manufactured using the glass composition for protecting a semiconductor junction according to the example 5. As the result, the score "good" is given when a reverse breakdown voltage characteristic of a semiconductor device falls within a normal range, and the score "bad" is given when a reverse breakdown voltage characteristic of a semiconductor device falls outside a normal range. As can be understood from FIG. 9, the glass compositions for protecting a semiconductor junction according to the comparison examples in FIGS. 7 to 9 are crystallized in the process of vitrification and hence, the evaluation in the evaluation aspect 5 cannot be carried out. Accordingly, "−" is described in the columns of the evaluation aspect 5 in FIG. 9.

(6) Evaluation Aspect 6 (Presence or Non-Presence of Crystallization)

A semiconductor device (pn diodes) is manufactured by a method substantially equal to the method of manufacturing a semiconductor device of the embodiment 6. As the result, the score "good" is given when vitrification can be performed without causing the crystallization of the glass composition in a manufacturing step, and the score "bad" is given when vitrification cannot be performed due to the crystallization.

(7) Evaluation Aspect 7 (Presence or Non-Presence of Generation of Bubbles)

The presence or non-presence of generation of bubbles in a glass layer is observed in a state where the glass layer is formed on a silicon substrate with an insulation layer interposed therebetween. That is, a semiconductor device (pn diode) is manufactured by a method substantially equal to the method of manufacturing a semiconductor device of the embodiment 6, and the observation is made whether or not bubbles are generated in the inside of the glass layer 124 (particularly, in the vicinity of an interface between the insulation layer 121 and the glass layer 124) (preliminary evaluation). Then, glass layers are formed on mirror-finished surfaces of silicon wafers by an electrophoresis method using respective glass compositions with an insulation layer interposed therebetween. After baking, the silicon wafer is divided by cutting into specimens having a size of 10 mm×10 mm. Then, the observation is made whether or not bubbles are generated in the inside of the glass layers of the specimens by a metallurgical microscope (subsequent evaluation).

For the reference purpose, the presence or non-presence of generation of bubbles is observed with respect to a case where a glass layer is formed on a silicon substrate without interposing an insulation layer therebetween in the same manner as the case where the glass layer is formed on the silicon substrate with the insulation layer interposed therebetween. That is, a semiconductor device (pn diode) is manufactured by a method substantially equal to the method of manufacturing a semiconductor device of the embodiment 4, and the observation is made whether or not bubbles are generated in the inside of the glass layer 124 (particularly, in the vicinity of an interface between the silicon substrate and the glass layer 124) (preliminary evaluation (reference)). Then, glass layers are formed on mirror-finished surfaces of silicon wafers by an electrophoresis method using respective glass compositions. After baking, the silicon wafer is divided by cutting into specimens having a size of 10 mm×10 mm. Then, the observation is made whether or not bubbles are generated in the glass layers of the specimens by a metallurgical microscope (subsequent evaluation (reference)).

FIG. 13A and FIG. 13B are views for explaining bubbles b generated in the inside of the glass layer 124 in the preliminary evaluation and the preliminary evaluation (reference). FIG. 13A is a cross-sectional view of a semiconductor device when no bubbles b are generated in the preliminary evaluation, while FIG. 13B is a cross-sectional view of a semiconductor device when bubbles b are generated in the preliminary evaluation (reference). FIG. 14A and FIG. 14B are photographs for explaining bubbles b generated in the inside of the glass layer in the subsequent evaluation and the subsequent evaluation (reference). FIG. 14A is a photograph showing an interface between the silicon substrate and the glass layer when no bubbles are generated in the subsequent evaluation in an enlarged manner, and FIG. 14B is a photograph showing an interface between the silicon substrate and the glass layer when bubbles b are generated in the subsequent evaluation (reference) in an enlarged manner. As the result of the experiment, it is found that there is enough correlation between the result of the preliminary evaluation of the present invention and the preliminary evaluation (reference) and the result of the subsequent evaluation of the present invention and the subsequent evaluation (reference). In the subsequent evaluation and the subsequent evaluation (reference), the score "good" is given when no bubbles having a diameter of 50 μm or more is generated in the inside of the glass layer, the score "fair" is given when one to twenty bubbles having a diameter of 50 μm or more are generated in the inside of the glass layer, and the score "bad" is given when twenty one or more bubbles having a diameter of 50 μm or more are generated in the inside of the glass layer. As can be understood from in FIG. 9, the glass compositions for protecting a semiconductor junction according to the comparison examples 7 to 9 are crystallized in the process of vitrification and hence, the evaluation in the evaluation aspect 7 cannot be carried out. Accordingly, "−" is described in the columns of the evaluation aspect 7 in FIG. 9.

(8) Comprehensive Evaluation

The score "good" is given when the score "good" is given with respect to all of the above-mentioned evaluation aspects 1 to 7, and the score "bad" is given when the score "fair" or "bad" is given with respect to at least one of the respective evaluation aspects.

3. Evaluation Result

As can be understood also from FIG. 9, in all glass compositions according to the comparison examples 1 to 9, the score "bad" is given with respect to at least one of the evaluation aspects so that the score "bad" is given with respect to the comprehensive evaluation. That is, in the glass compositions according to the comparison examples 1 to 6, the score "bad" is given with respect to the evaluation aspect 3. Further, in the glass compositions according to the comparison examples 7 to 9, the score "bad" is given with respect to the evaluation aspect 6.

To the contrary, in all glass compositions according to the examples 1 to 5, the score "good" is given with respect to all evaluation aspects (evaluation aspects 1 to 7). As the result, it is found that, although all glass compositions according to the examples 1 to 5 contain no lead, these glass compositions satisfy all the following conditions (a) to (d), that is, the condition (a) that the glass composition can be baked at a proper temperature (for example, 1000° C. or below), the condition (b) that the glass composition withstands chemicals (fluoric acid) used in steps, the condition (c) that the glass composition has a linear expansion coefficient close to a linear expansion coefficient of silicon (particularly an average linear expansion coefficient at a temperature of 50° C. to 550° C. being close to a linear expansion coefficient of silicon), and the condition (d) that the glass composition has excellent insulation property. It is also found that these glass compositions satisfy the condition (e) that the glass composition is not crystallized in the process of vitrification, and the condition (f) that the occurrence of a state that a reverse breakdown voltage characteristic of the semiconductor device is deteriorated can be suppressed by suppressing the generation of bubbles which may be generated from an interface between the semiconductor base body (silicon) and the insulation layer formed on the semiconductor base body in a process of baking "a layer made of the glass composition for protecting a semiconductor junction" formed by an electrophoresis method.

According to the examples 1 to 5, when the glass layer is formed on the silicon substrate with the insulation layer interposed therebetween, the glass layer 124 is brought into contact with the insulation layer having higher wettability than the semiconductor base body and hence, bubble are hardly generated from an interface between the semiconductor base body (insulation layer) and the glass layer in a process of forming the glass layer by baking the layer made of the glass composition. Therefore, it is possible to suppress the generation of such bubbles without adding a component having a defoaming action such as nickel oxide or with a small amount (for example, 2.0 mol % or less) of such a component even when the component is added.

The following is also found. That is, when a resin-sealed semiconductor device is fabricated by molding a semiconductor device manufactured above with a resin, such a resin-sealed semiconductor device exhibits higher resistance to a reverse bias at a high temperature than a resin-sealed semiconductor device which is fabricated by molding a semiconductor device with a resin using a conventional "glass material containing lead silicate as a main component".

Although the glass composition for protecting a semiconductor junction, the method of manufacturing a semiconductor device and such a semiconductor device according to the present invention have been explained heretofore in conjunction with the above-mentioned embodiments, the present invention is not limited to the above-mentioned embodiments, and can be carried out without departing from the gist of the present invention. For example, the following modifications are conceivable.

(1) In the above-mentioned embodiments 4 to 7, although the glass layer is formed using the glass composition for protecting a semiconductor junction of the embodiment 1, the present invention is not limited to such glass composition. For example, the glass layer may be formed using other glass compositions for protecting a semiconductor junction within the scope of claim 1.

(2) In the above-mentioned embodiments 1 to 3, although nickel oxide is used as "at least one metal oxide selected from a group consisting of nickel oxide, copper oxide, manganese oxide and zirconium oxide", the present invention is not limited to nickel oxide. For example, in place of nickel oxide, copper oxide, manganese oxide or zirconium oxide may be used. Further, the glass composition for protecting a semiconductor junction may not use "at least one metal oxide selected from a group consisting of nickel oxide, copper oxide, manganese oxide and zirconium oxide".

(3) In the above-mentioned embodiments 4 and 6, the glass layer is formed by an electrophoresis method. However, the present invention is not limited to such a method. For example, the glass layer may be formed by a spin coating method, a screen printing method, a doctor blade method or other glass layer forming methods.

(4) In the above-mentioned embodiments 5 and 7, the glass layer is formed by a spin coating method. However, the present invention is not limited to such a method. For example, the glass layer may be formed by an electrophoresis method, a screen printing method, a doctor blade method or other glass layer forming methods.

In the above-mentioned constitutions (3) and (4), when a glass layer is formed by a spin coating method, a screen printing method or a doctor blade method, it is preferable to form the glass layer using a mixture which is obtained by adding an organic binder to the glass composition for protecting a semiconductor junction of the present invention. For example, by applying a mixture produced by adding an organic binder to the glass composition for protecting a semiconductor junction of the present invention to a semiconductor base body by coating using a predetermined method, the organic binder is dissipated during at the time of baking glass so that a desired glass layer can be formed.

(5) In the above-mentioned respective embodiments 6 and 7, an insulation layer formed of a silicon oxide film is formed by a thermal oxidation method using dry oxygen ($DryO_2$). However, the present invention is not limited to such an insulation film. For example, an insulation layer formed of a silicon oxide film may be formed by a thermal oxidation method using dry oxygen and nitrogen ($DryO_2+N_2$), an insulation layer formed of a silicon oxide film may be formed by a thermal oxidation method using wet oxygen ($WetO_2$), or an insulation layer formed of a silicon oxide film may be formed by a thermal oxidation method using wet oxygen and nitrogen ($WetO_2+N_2$). Further, an insulation layer formed of a silicon oxide film may be formed by CVD. Moreover, an insulation layer formed of a film other than a silicon oxide film (for example, an insulation layer formed of a silicon nitride film, a high-resistance semi-insulation layer (for example, SIPOS) or the like) may be formed.

(6) In the above-mentioned embodiments 4 and 6, the photoresist 126 is used as a mask when the oxide film 116 is etched. However, the present invention is not limited to the photoresist 126. For example, a pitch-based glass protective film may be used as the mask.

(7) In the above-mentioned embodiments 5 and 7, the semiconductor base body where the $n^-$ type epitaxial layer 212 is laminated on the $n^+$ type silicon substrate 210 is used. However, a semiconductor base body where an $n^+$ type layer is formed by diffusing a p type impurity such as phosphorus into an $n^-$ type silicon substrate may be used.

(8) In the present invention, it is preferable to use the glass composition which is hardly crystallized in a process of baking the glass composition layer. With the use of such glass composition, it is possible to manufacture a semiconductor device having a low reverse leakage current in a stable manner. In this respect, the present invention differs from the technique disclosed in JP-A-63-117929 where the glass composition is converted into a glass ceramic body having high degree of crystallinity in the process of baking a glass layer.

(9) In the present invention, it is preferable to use a raw material which substantially contains no Bi. With the use of such a raw material, the glass layer is hardly crystallized in the process of baking the glass composition layer so that a semiconductor device having a low reverse leakage current can be manufactured in a stable manner. In this respect, the present invention differs from the technique disclosed in JP-T-2005-525287 where a raw material which contains Bi is used.

(10) In the present invention, it is preferable to use a raw material which substantially contains no Cu. With the use of such a raw material, the glass layer is hardly crystallized in the process of baking the glass composition layer. Accordingly, it is possible to manufacture a semiconductor device having a low reverse leakage current in a stable manner. In this respect, the present invention differs from the technique disclosed in JP-A-2001-287984 where a raw material which contains Cu is used.

(11) In the present invention, a raw material which substantially contains neither Li nor Pb is used. In this respect, the present invention differs from the technique disclosed in JP-A-2002-16272 where a raw material containing Li and Pb is used.

(12) In the present invention, it is preferable to use a raw material which substantially contains no P. With the use of such a raw material, it is possible to prevent the diffusion of P (phosphorous) into the semiconductor base body from the glass layer in the process of baking the layer made of the glass composition for protecting a semiconductor junction and hence, a highly reliable semiconductor device can be manufactured.

(13) In the above-mentioned embodiments 4 to 7, the present invention has been explained by taking diodes (mesa-type pn diode, planar-type pn diode) as an example. However, the present invention is not limited to such diodes. The present invention is also applicable to all types of semiconductor devices where a pn junction is exposed (for example, thyristor, power MOSFET, IGBT and the like).

(14) In the above-mentioned embodiments 4 to 7, a substrate made of silicon is used as a semiconductor substrate. However, the present invention is not limited to such a silicon substrate. For example, other semiconductor substrates such as an Sic substrate, a GaN substrate and a Gao substrate can be used.

[Explanation of Symbols]
100, 102, 200, 202, 900: semiconductor device
110, 910: $n^-$ type semiconductor substrate
112, 912: $p^+$ type diffusion layer
114, 914: $n^-$ type diffusion layer
116, 118, 916, 918: oxide film
120, 920: trench
121, 218: insulation layer
124, 220, 924: glass layer
126, 926: photoresist
130, 930: portion where Ni-plating electrode film is to be formed
132, 932: roughened surface region
134, 222, 934: anode electrode
136, 224, 936: cathode electrode
210: $n^+$ type semiconductor substrate
212: $n^-$ type epitaxial layer
214: $p^+$ type diffusion layer
216: $n^+$ type diffusion layer
b: bubbles

The invention claimed is:

1. A glass composition for protecting a semiconductor junction, wherein the glass composition for protecting a semiconductor junction is made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, and contains no filler.

2. The glass composition for protecting a semiconductor junction according to claim 1, wherein the raw material contains, as the oxide of alkaline earth metal, one oxide of alkaline earth metal selected from a group consisting of CaO and BaO.

3. The glass composition for protecting a semiconductor junction according to claim 1, wherein the raw material contains, as the oxide of alkaline earth metal, two oxides of alkaline earth metalss selected from a group consisting of CaO, BaO and MgO.

4. The glass composition for protecting a semiconductor junction according to claim 1, wherein the raw material contains, as the oxide of alkaline earth metal, all oxides of alkaline earth metalss consisting of CaO, BaO and MgO.

5. The glass composition for protecting a semiconductor junction according to claim 1, wherein the raw material substantially contains no P.

6. The glass composition for protecting a semiconductor junction according to claim 1, wherein the raw material substantially contains no Bi.

7. The glass composition for protecting a semiconductor junction according to claim 1, wherein the raw material further contains at least one metal oxide selected from a group consisting of nickel oxide, copper oxide, manganese oxide and zirconium oxide.

8. The glass composition for protecting a semiconductor junction according to claim 1, wherein an average linear expansion coefficient within a temperature range of 50° C. to 550° C. falls within a range of $3.3 \times 10^{-6}$ to $4.5 \times 10^{-6}$.

9. The glass composition for protecting a semiconductor junction according to claim 1, wherein the content of $SiO_2$ falls within a range of 50.0 mol % to 68.0 mol %, the content of $B_2O_3$ falls within a range of 6.0 mol % to 18.0 mol %, the content of $Al_2O_3$ falls within a range of 7.0 mol % to 18.0 mol %, and the content of the oxide of alkaline earth metal falls within a range of 7.0 mol % to 18.0 mol %.

10. A method of manufacturing a semiconductor device comprising, in the following order:
a first step of preparing a semiconductor element having a pn junction exposure portion where a pn junction is exposed; and
a second step of forming a glass layer such that the glass layer covers the pn junction exposure portion, wherein
in the second step, the glass layer is formed using a glass composition for protecting a semiconductor junction which is made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, and contains no filler.

11. The method of manufacturing a semiconductor device according to claim 10, wherein
the first step includes: a step of preparing a semiconductor base body having a pn junction parallel to a main surface thereof; and a step of forming the pn junction exposure portion in the inside of a trench by forming the trench from one surface of the semiconductor base body with a depth exceeding the pn junction, and
the second step includes a step of forming the glass layer such that the glass layer covers the pn junction exposure portion in the inside of the trench.

12. The method of manufacturing a semiconductor device according to claim 11, wherein the second step includes a step of forming the glass layer such that the glass layer directly covers the pn junction exposure portion in the inside of the trench.

13. The method of manufacturing a semiconductor device according to claim 11, wherein the second step includes a step of forming an insulation layer or a high-resistance semi-insulation layer on the pn junction exposure portion in the inside of the trench, and a step of forming the glass layer such that the glass layer covers the pn junction exposure portion with the insulation layer or a high-resistance semi-insulation layer interposed therebetween.

14. The method of manufacturing a semiconductor device according to claim 10, wherein
the first step includes a step of forming the pn junction exposure portion on a surface of a semiconductor base body, and
the second step includes a step of forming the glass layer such that the glass layer covers the pn junction exposure portion on the surface of the semiconductor base body.

15. The method of manufacturing a semiconductor device according to claim 14, wherein the second step includes a step of forming the glass layer such that the glass layer directly covers the pn junction exposure portion on the surface of the semiconductor base body.

16. The method of manufacturing a semiconductor device according to claim 14, wherein the second step includes a step of forming an insulation layer or a high-resistance semi-insulation layer on the pn junction exposure portion on a surface of the semiconductor base body, and a step of forming the glass layer such that the glass layer covers the pn junction exposure portion with the insulation layer or a high-resistance semi-insulation layer interposed therebetween.

17. The method of manufacturing a semiconductor device according to claim 13, wherein the glass composition for protecting a semiconductor junction is a glass composition for protecting a semiconductor junction which substantially contains no multivalent element as a defoaming agent.

18. The method of manufacturing a semiconductor device according to claim 17, wherein the multivalent element contains V, Mn, Sn, Ce, Nb and Ta.

19. A semiconductor device comprising:
a semiconductor element having a pn junction exposure portion where a pn junction is exposed; and
a glass layer which is formed such that the glass layer covers the pn junction exposure portion, wherein
the glass layer is formed using a glass composition for protecting a semiconductor junction made of fine glass particles prepared from a material in a molten state obtained by melting a raw material which contains at least $SiO_2$, $B_2O_3$, $Al_2O_3$ and oxide of alkaline earth metal and substantially contains none of Pb, As, Sb, Li, Na, K and Zn, the glass composition for protecting a semiconductor junction containing no filler.

20. The method of manufacturing a semiconductor device according to claim 16, wherein the glass composition for protecting a semiconductor junction is a glass composition for protecting a semiconductor junction which substantially contains no multivalent element as a defoaming agent.

21. The method of manufacturing a semiconductor device according to claim 20, wherein the multivalent element contains V, Mn, Sn, Ce, Nb and Ta.

* * * * *